US011691518B2

United States Patent
Holme

(10) Patent No.: US 11,691,518 B2
(45) Date of Patent: Jul. 4, 2023

(54) PREDICTIVE MODEL FOR ESTIMATING BATTERY STATES

(71) Applicant: QuantumScape Battery, Inc., San Jose, CA (US)

(72) Inventor: Tim Holme, San Jose, CA (US)

(73) Assignee: QuantumScape Battery, Inc., San Jose, CA (US)

( * ) Notice: Subject to any disclaimer, the term of this patent is extended or adjusted under 35 U.S.C. 154(b) by 493 days.

(21) Appl. No.: 16/632,330

(22) PCT Filed: Nov. 28, 2017

(86) PCT No.: PCT/US2017/063397
§ 371 (c)(1),
(2) Date: Jan. 17, 2020

(87) PCT Pub. No.: WO2019/017991
PCT Pub. Date: Jan. 24, 2019

(65) Prior Publication Data
US 2020/0164763 A1    May 28, 2020

Related U.S. Application Data

(60) Provisional application No. 62/535,778, filed on Jul. 21, 2017.

(51) Int. Cl.
*G01R 31/36*  (2020.01)
*B60L 3/12*  (2006.01)
*G01R 31/396*  (2019.01)
*G01R 31/382*  (2019.01)
*B60L 50/60*  (2019.01)
*B60L 58/12*  (2019.01)

*H01M 10/48*  (2006.01)
*H01M 50/204*  (2021.01)

(52) U.S. Cl.
CPC ............... *B60L 3/12* (2013.01); *B60L 50/66* (2019.02); *B60L 58/12* (2019.02); *G01R 31/3648* (2013.01); *G01R 31/382* (2019.01); *G01R 31/396* (2019.01); *H01M 10/486* (2013.01); *H01M 50/204* (2021.01)

(58) Field of Classification Search
CPC . B60L 3/12; B60L 50/66; B60L 58/12; G01R 31/3648
See application file for complete search history.

(56) References Cited

U.S. PATENT DOCUMENTS

| 5,441,575 A | 8/1995 | Underwood et al. |
| 9,393,921 B1 | 7/2016 | Weicker et al. |
| 2003/0184307 A1 | 10/2003 | Kozlowski et al. |

(Continued)

OTHER PUBLICATIONS

International Search report and Written opinion of PCT/US2017/063397 dated Apr. 16, 2018, 15 pages.

*Primary Examiner* — Alvaro E Fortich
(74) *Attorney, Agent, or Firm* — Squire Patton Boggs (US) LLP

(57) ABSTRACT

A battery management system (BMS) for a vehicle includes a module for estimating the state of a rechargeable battery, such as its state of charge, in real time. The module includes a learning model for predicting the state of a battery based on the vehicle's usage and related factors unique to the vehicle, in addition to a sensed voltage, current and temperature of a battery.

21 Claims, 9 Drawing Sheets

(56) References Cited

U.S. PATENT DOCUMENTS

| | | | |
|---|---|---|---|
| 2010/0299054 A1* | 11/2010 | Hennequet | G01C 21/3492 701/123 |
| 2011/0156657 A1* | 6/2011 | Anderson | H02J 7/0069 320/134 |
| 2013/0091083 A1* | 4/2013 | Frisch | G06N 20/00 706/14 |
| 2013/0261914 A1* | 10/2013 | Ingram | B64D 27/24 701/423 |
| 2014/0129163 A1 | 5/2014 | Betzner | |
| 2014/0225620 A1* | 8/2014 | Campbell | H04Q 9/00 324/426 |
| 2015/0255774 A1* | 9/2015 | Menzies | H01M 50/502 429/158 |
| 2015/0357644 A1* | 12/2015 | Holme | H01M 4/485 429/231.95 |
| 2016/0133892 A1* | 5/2016 | Uhm | H01M 50/209 429/163 |
| 2017/0005367 A1* | 1/2017 | Van Berkel | H01M 10/0565 |

* cited by examiner

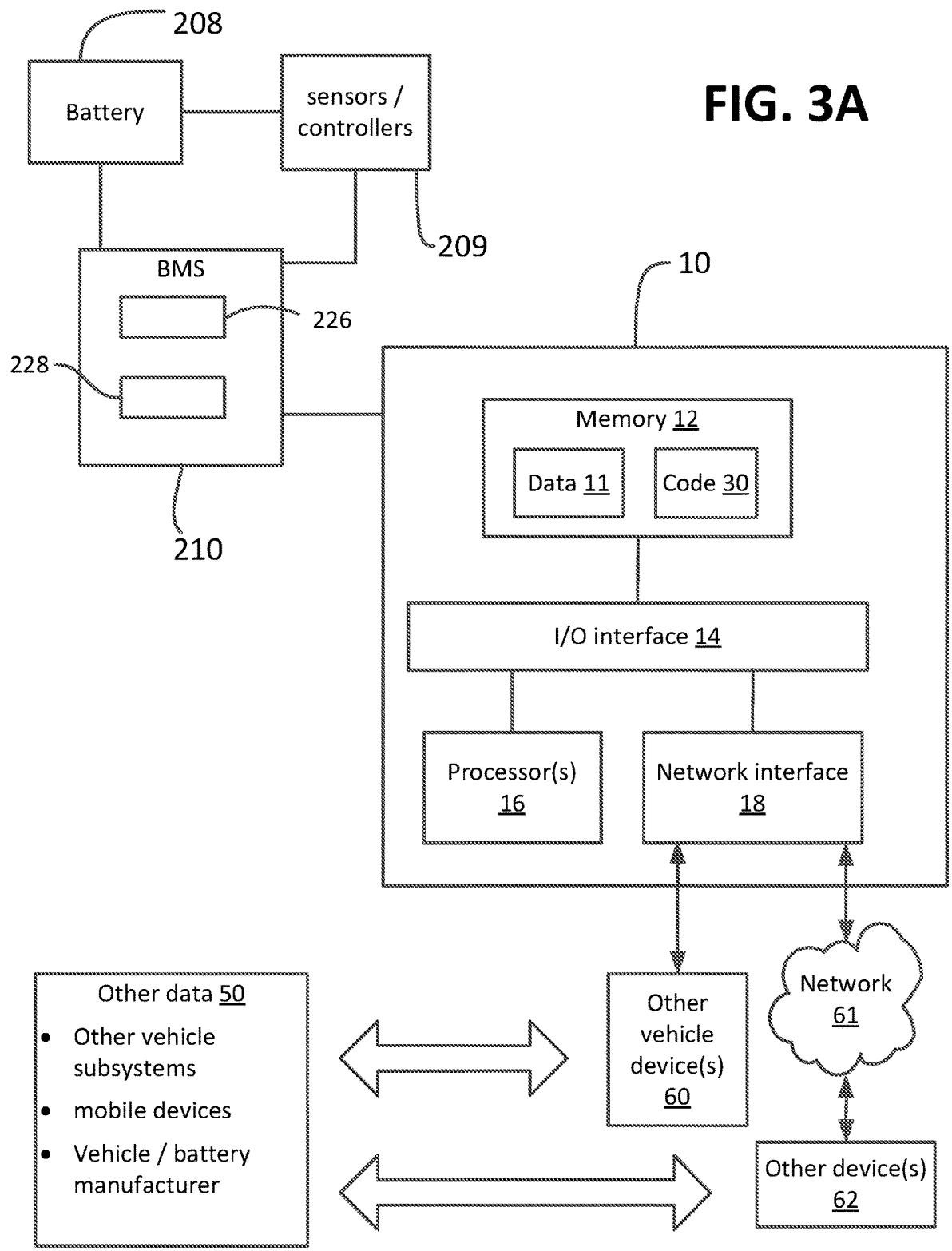

PREDICTIVE MODEL FOR ESTIMATING BATTERY STATES

CROSS-REFERENCE TO RELATED APPLICATIONS

This application is a National Stage of International Application No. PCT/US2017/063397, filed on Nov. 28, 2017, and published as WO 2019/017991 on Jan. 24, 2019, and entitled "PREDICTIVE MODEL FOR ESTIMATING BATTERY STATES," which claims priority to, and the benefit of, U.S. Patent Application No. 62/535,778, filed Jul. 21, 2017, and entitled "PREDICTIVE MODEL FOR ESTIMATING BATTERY STATES," the contents of each of which are incorporated herein by reference in their entirety for all purposes.

FIELD

This disclosure is generally related to battery control systems and battery management systems (BMS); and electrochemical cells and rechargeable batteries containing the same.

BACKGROUND

One important component of electrical vehicles is the secondary battery system (i.e., traction rechargeable battery), which provides power to the vehicle and determines vehicle performance. In many applications, this battery is a lithium secondary battery, for example, a solid-state lithium secondary battery. Secondary batteries, as opposed to primary batteries, are rechargeable. Lithium ion and lithium metal batteries are useful in automotive applications because of their high specific energy and energy density, long cycle life, high round trip efficiency, low self-discharge, and long shelf life.

Knowledge about a state of the battery during use is, of course, critical to widespread acceptance of electric vehicles as a reliable source for transportation. However, the existing metrics used to determine such quantities as a battery's state of charge (SOC) are often inaccurate, especially as a battery ages.

A battery's state is affected by a variety of factors, including environmental, vehicle type and condition, and the use characteristics of the vehicle, i.e., how it is typically driven. Typical models for estimating the state of a battery are insufficient for reliable predictions because the models don't adequately take into account these factors when a prediction is made relating to the state of a battery.

SUMMARY

The instant disclosure sets forth methods and systems using novel inputs and combinations of inputs to predict a state of a battery, e.g., state of charge, for a secondary battery of a vehicle.

In one aspect, the instant disclosure sets forth methods, systems, and apparatuses for predicting a state of a battery so that the battery has a predictable performance when in use.

In another aspect, the instant disclosure sets forth methods, systems, and apparatuses for predicting a state of a lithium secondary battery so that this battery has a predetermined performance at the time the battery is used in an electric vehicle.

In another aspect, the instant disclosure sets forth methods, systems, and apparatuses for predicting a state of a lithium secondary battery for purposes such as monitoring the health of the battery, indicating any safety or repair conditions of the battery, and generating diagnostics of the battery before a planned use to avoid damage to the battery and assess whether the battery is capable of performing as expected.

According to the various embodiments disclosed herein, there is a method, system and apparatus for managing an electrochemical battery using a prediction module (PM), which predicts a state of a battery type. The PM includes:
- a battery model that predicts one or more battery states based on input parameters relating to the one or more battery states.
- a learning component that periodically trains, or updates the battery model based on recently-obtained training set data about the battery, a vehicle powered by the battery and/or a person operating the vehicle.
- a prediction component that uses a most recently-trained version of the battery model to make predictions about a battery state (e.g. SOC) in response to a current set of input parameters.

According to the various embodiments the PM may further include, as a separate module or part of the prediction module a decision component that decides on the best course of action for vehicle operation and/or the driver's planned use of the vehicle, e.g., minimize non-essential power demand; modify trip; etc. based on the prediction component's predicted battery state.

According to the various embodiments, the PM may make predictions and/or decisions based on data provided by sensors that measure a physical state of the battery, as well as sensor and controller data that monitors or regulates a load current on the battery. The battery sensor data includes such things as a battery's existing temperature, pressure and voltage. The sensor and controller data relates to a vehicle subsystem that draws or pushes current from/to the battery. Additionally, the prediction module makes use of other data, in addition to a battery's present temperature, terminal voltage, and current. Such other data may be classified as:
- Specific to the battery, e.g., age or number of cycles, capacity fade as a function of time, voltage fade as a function of time, impedance rise as a function of time;
- General to the battery, e.g., type of chemistry, packaging, control devices (active/passive pressure or temperature management);
- Specific to the user, e.g., driving behavior patterns, trips planned/taken, vehicle stored outdoors or indoors, idle/unused time for the vehicle;
- Specific to the vehicle, e.g., powertrain efficiency, power requirements of subsystems;
- General to the user, e.g., demographic, age, profession;
- General to the vehicle, e.g., car make and model, commercial or private use
- Historical, e.g., repair history, age of car and battery, number of discharges, number of prior repair or safety conditions; temperature history of the battery, cumulative energy and capacity throughput, and
- Geographic, e.g., weather and location of where vehicle was, or is currently being used.

According to the various embodiments disclosed herein, the battery model and/or vehicle/driver model makes use of various combinations or sub-combinations of the above types of input parameters. These combinations or sub-combinations are used to predict a battery state, which can be at least one of a state-of-charge (SOC), state-of-health (SOH), power availability, energy availability, energy availability with respect to a planned route, presence of a safety condition, presence of a repair condition, battery life, battery temperature, battery voltage, battery impedance, and battery cell pressure.

In general, predictions about the battery state may be used as input to a second learning model, or incorporated into the same learning model to provide information to the driver or the vehicle system. The information can inform driver decisions such as "Can I get there?" "Is it safe, or advisable to use the battery?" "Should I get the BMS serviced?" and "Do I need to charge the battery now, or can the vehicle travel another 30 miles to the next charging station?" The information can inform vehicle decisions such as "what preheating or pressurization is required for the battery to perform at an optimal level, which requires discharging battery?" "What, if any, energy usage to modulate in order to make a safe, damage-free trip possible?" "Is there an alternative route or different trip time available that makes a planned trip possible?" or "what non-battery-state safety/repair conditions may exist within the vehicle based on the predicted battery state?"

In various embodiments, a prediction about the battery state is used to decide whether to modulate power consumed by a vehicle's power train and/or a vehicle accessory so that power demand does not exceed a predicted capacity for the battery. For instance, a load controller can operate to power down or power on a vehicle accessory based on a predicted SOC and estimated demand or planned use for the vehicle. Vehicle accessories include one or more of a cabin climate control system, an air conditioner, a heater, a seat warmer, an audio system, an auxiliary battery charger, and a light.

A vehicle's existing battery management system (BMS) may incorporate, in whole or in part, the PM. For example, the PM may be separate from the BMS, but receive processed data from the BMS.

In various embodiments, the battery is a lithium ion secondary battery (e.g., a solid-state secondary battery). In such cases, the lithium ion secondary battery includes a cathode including conversion chemistry active materials. In such cases, the lithium ion secondary battery includes a lithium metal anode. In such cases, the lithium ion secondary battery includes a solid-state electrolyte. In such cases, the lithium ion secondary battery includes a solid-state electrolyte and does not include a liquid electrolyte. In some embodiments, the lithium ion secondary battery may include a cathode including lithium intercalation chemistry active materials.

Some of the embodiments disclosed herein have the advantage that the prediction module can be applied to a variety of BMS employing different arrangements of batteries, types of batteries and vehicle powertrains. Some of the embodiments of the predictive module can make predictions on a battery state based on a wide variety vehicle type and BMS designs. The ensemble of input needed to make predictions according to these embodiments of the predictive model is common to different types of vehicle platforms that share some common characteristics with the battery system, such as a similar electrochemical process for charging and discharging the battery.

In various embodiments, a training process for a battery model tunes or adjusts the model's weights or parameters. These model parameters are combined with the model's features or input parameters (e.g., current, voltage and temperature of a battery cell) to predict an output value or objective. The model is trained using values for the model's input parameters, which are called training sets. For supervised training the model is trained using these values and corresponding (known) outputs for tuning the model's parameters. In one example, a Random Forest model is formulated and continuously trained via supervised learning. For example, the model is trained whenever data is available for a training set, e.g., on a second-by-second basis, or every second while the battery is in use.

A BMS used with, or incorporating all or some of a PM refers to a BMS of either a battery electric vehicle (BEV) or plug-in-hybrid electric vehicle (PHEV). In other embodiments, a BMS used in an aerial vehicle, such as an unmanned aerial vehicle (UAV), may incorporate a PM as-disclosed herein that make predictions independent of the specific vehicle make or model, but uses the same battery chemistry.

These and other features will be described below with reference to the associated drawings.

INCORPORATION BY REFERENCE

All publications and patent applications mentioned in the present specification are herein incorporated by reference to the same extent as if each individual publication or patent application was specifically and individually indicated to be incorporated by reference. To the extent there are any inconsistent usages of words and/or phrases between an incorporated publication or patent and the present specification, these words and/or phrases will have a meaning that is consistent with the manner in which they are used in the present specification.

BRIEF DESCRIPTION OF THE DRAWINGS

FIGS. 3A and 3B block diagrams of two embodiments of a management system for an electrochemical battery. The block diagram shows elements of the system with connecting lines between blocks. Where there is a line without arrows connecting two blocks, such as the line connecting block 210 to block 10 in FIG. 3A, the connecting line is indicating only an electrical connection (wired or wireless) between the blocks, for purposes of transferring data between processor and/or memory elements of the blocks. It is understood that the connecting lines are not intended to indicate or imply a particular circuitry or layout for the management system.

DETAILED DESCRIPTION

Figure 1:
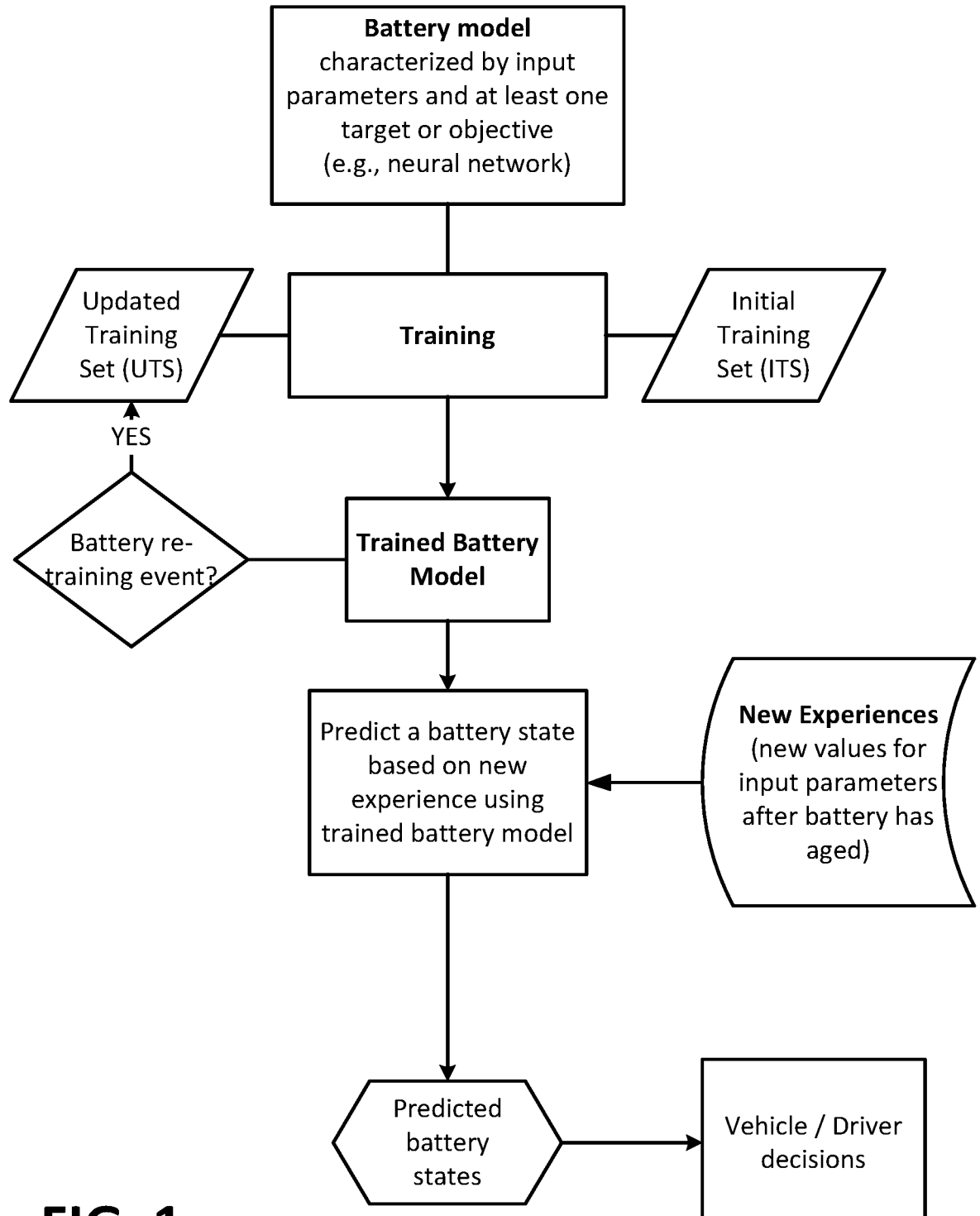
FIG. 1 is a diagram showing a flow process for training and re-training a battery model, and using the trained battery model to predict a battery state.

In the description like reference numbers appearing in the drawings and description designate corresponding or like elements among the different views.

For purposes of this disclosure, the following terms and definitions apply:

In addition to the Battery-related and computer-/software-related terms defined below, this application adopts the terms defined in U.S. Pat. No. 9,393,921, and US20160059733, to the extent that the same terms are not already defined below and do not otherwise contradict a given meaning for a term defined below. The terms defined below take precedence over the same terms that may also be defined U.S. Pat. No. 9,393,921 or US20160059733.

As used herein, the term "state of the battery" or "battery state" can refer to any one of, or a combination of a state-of-charge (SOC), state-of-health (SOH), power available, energy available, energy available with respect to a planned route, presence of a safety condition, presence of a repair condition, battery life, battery temperature, battery voltage, battery impedance, or battery cell pressure.

As used herein, the term "initial training set (ITS)" refers to a training set used to train a battery model before the battery is used, e.g., prior to a vehicle purchase; and the term "update training set (UTS)" refers to a training set (TS) used to train a battery model as a vehicle ages, i.e., after the battery is installed in the vehicle and charged and discharged by the vehicle owner. The ITS and UTS have known values for the input parameters. The data associated with these values may be observed data, measured data, data obtained from memory residing in the vehicle, and/or data received over a wireless network. The training set data may include resistance as a function of state-of-charge, voltage response to different current or power draws for varying time intervals across the state-of-charge, battery temperature data, and may be data describing single battery cells or data aggregated across parallel and/or series segments of battery cells. For supervised training, the ITS and UTS also have values for the corresponding output target or objective. All targets are known quantities for the ITS. However, some targets are not known for a UTS. An example of an unknown target is SOC.

As used herein, the phrase "battery management system (BMS)" refers to the various components of the battery system, which can include a member selected from battery cells of various types, a computer coupled to a memory and processing unit, a sensor or analog measuring circuit to measure one or more voltages of battery cells or groups of battery cells, an analog to digital converter capable of translating sensor or voltage information to a digital format, a computer processor capable of performing mathematical and logical operations, a means of disconnection or controlling the battery systems output (i.e. relay, contactor, solid-state switch), a communication network between the battery system and the load (i.e. an electric vehicle), a plurality of temperature sensors capable of measuring the temperature of the battery cells or groups of battery cells, or as otherwise known in the art.

As used herein, the term "impedance" refers to electrical resistance, generally, and includes Ohmic resistance and resistance due to chemical reactions (known as reactive impedance), or as otherwise known in the art. Impedance can be measured using electrical impedance spectroscopy methods.

As used herein, the term "cell stack" refers to one or more units which each include at least a negative electrode (e.g., Li, $LiC_6$), a positive electrode (e.g., Li-nickel-manganese-oxide or $FeF_3$, optionally combined with a solid-state electrolyte or a gel electrolyte), and a solid electrolyte (e.g., an oxide electrolyte set forth herein) between and in contact with the positive and negative electrodes. In some examples, between the solid electrolyte and the positive electrode, there is an additional layer comprising a gel electrolyte. An electrochemical stack may include one of these aforementioned units. An electrochemical stack may include several of these aforementioned units arranged in electrical communication (e.g., serial or parallel electrical connection). In some examples, when the electrochemical stack includes several units, the units are layered or laminated together in a column. In some examples, when the electrochemical stack includes several units, the units are layered or laminated together in an array. In some examples, when the electrochemical stack includes several units, the stacks are arranged such that one negative electrode is shared with two or more positive electrodes. Alternatively, in some examples, when the electrochemical stack includes several units, the stacks are arranged such that one positive electrode is shared with two or more negative electrodes. Unless specified otherwise, an electrochemical stack includes one positive electrode, one solid electrolyte, and one negative electrode, and optionally includes a gel electrolyte layer between the positive electrode and the solid electrolyte.

As used herein, the term "load current" includes drawing electrical current from, or pushing current to, a power source, or as otherwise known in the art. For example a load current can include drawing current from a battery while discharging or pushing current to the battery while recharging the battery. Thus, both positive and negative currents are contemplated by the term "load current."

As used herein, the term "state of charge," as shown as the acronym "SOC," includes the extent to which a given battery cell is charged or discharged with respect to the charge capacity of the battery cell. For example, when a battery cell possesses half of the capacity of the battery cell at full charge, the battery has an SOC of 50%. The percentage (%) given is made with respect to the as-rated battery SOC (new battery). Thus, an aged battery when fully charged (maximum charging capacity) may have a SOC of only 50% of the as-rated SOC, whereas the same battery when new and fully charged has an SOC of 100%. As used herein, the phrase "full charge," refers to an electrochemical cell having a 100% state-of-charge (SOC). As used herein, the phrase "less than a full charge," refers to an electrochemical cell having a SOC less than 100%. A stated SOC may be made relative to an as-rated or nameplate capacity of the battery when the SOC measured at the beginning of life of the battery and at a specified discharge rate and temperature.

As used herein, the term "solid-state battery" includes an electrochemical-energy storage cell having a solid-state electrolyte. A solid-state battery can comprise gel electrolytes as well as solid electrolytes. As used herein, the term "solid-state electrolyte," refers to an electrolyte, as defined herein, wherein the electrolyte is a solid.

As used herein, the term "abnormal" refers to a state of the battery as a function of, but not limited to, open-circuit voltage (OCV), resistance, impedance, capacity, temperature, calendar life, pressure, and historical use, any of which are associated with the battery performing at 80% or less of its theoretical power rate or energy density. For example, abnormal may refer to a value outside a range of pre-determined values assigned to a particular battery health metric. For example, if a battery is rated by its manufacturer to have a power rate of 100 Amp-hrs at 80° C. (e.g., specifying a state of health of 100%) when fully charged, then an abnormal state will include an OCV, resistance, impedance, capacity, temperature, calendar life, pressure, and/or historical use that is associated with 80 Amp-hrs or less at 80° C. (e.g., defining a state of health of 0%) when the battery is fully charged. For example, if a battery is rated by its manufacturer to have an energy density of 1000 W/L at 80° C., then an abnormal state will include an OCV, resistance, impedance, capacity, temperature, calendar life, and/or historical use that is associated with 800 W/L or less at 80° C.

As used herein, the term "normal" refers to a state of the battery as a function of, but not limited to, OCV, resistance, capacity, temperature, calendar life, pressure and/or historical use. For example, normal may refer to a value within a range of pre-determined values assigned to a particular battery health metric. For example, if a battery is rated by its manufacturer to have a power rate of 100 Amp-hrs at 80° C. (e.g., specifying a state of health of 100%) when fully charged, then a normal state will include an OCV, resistance, impedance, capacity, temperature, calendar life, pressure and/or historical use that is associated with 80 Amp-hours or more at 80° C. (e.g., defining a state of health of 0%) when the battery is fully charged.

As used herein, the term "battery" refers to an electrochemical device or an energy storage device—such as, but not limited to—a Li-secondary battery that operates or produces electricity or an electrical current by an electrochemical reaction. And "battery" can refer to any of a battery cell, a stack of battery cells, a pouch comprising battery cells, a can comprising battery cells, a module comprising can cellss, and a battery pack.

As used herein, the phrases "electrochemical cell" or "battery cell" shall mean a single cell including a positive electrode and a negative electrode, which have ionic communication between the two using an electrolyte. In some embodiments, the same battery cell includes multiple positive electrodes and/or multiple negative electrodes enclosed in one container.

As used herein, the terms "positive electrode" and "negative electrode" refer to the electrodes of a battery. During a charge cycle in a Li-secondary battery, Li ions leave the positive electrode and move through an electrolyte, to the negative electrode. During a charge cycle, electrons leave the positive electrode and move through an external circuit to the negative electrode. During a discharge cycle in a Li-secondary battery, Li ions migrate towards the positive electrode through an electrolyte and from the negative electrode. During a discharge cycle, electrons leave the negative electrode and move through an external circuit to the positive electrode.

As used herein, the term "electrolyte," refers to an ionically conductive and electrically insulating material. Electrolytes are useful for electrically insulating the positive and negative electrodes of a secondary battery while allowing for the conduction of ions, e.g., $Li^+$, through the electrolyte. In some of the electrochemical devices described herein, the electrolyte includes a solid film, pellet, or monolith of a $Li^+$ conducting oxide, such as a lithium-stuffed garnet. In some examples, the electrolyte further includes a gel electrolyte which is laminated to or directly contacting the solid film, pellet, or monolith. As used herein, the phrase "lithium stuffed garnet" refers to oxides that are characterized by a crystal structure related to a garnet crystal structure.

As used herein, the term "charging," or the phrase "charging the electrochemical cell," unless specified otherwise to the contrary, refers to a process whereby energy is applied to an electrochemical cell in order to increase its SOC. Charging typically involves applying a high voltage to the battery in a polarity that causes positive ions to flow from the positive electrode to the negative electrode.

As used herein, the phrase "electrical communication" refers to the juxtaposition of two materials such that the two materials contact each other sufficiently to conduct either an ion or electron current. As used herein, direct contact may also refer to two materials in contact with each other and which do not have any other different types of solid or liquid materials positioned between the two materials which are in direct contact.

As used herein, the term battery "age" will mean either the calendar months or years since the battery was first fully charged, or the number of cycles of charge-discharge, or a combination of the two.

As used herein, the phrase "safety condition" refers to a condition that involves a potential hazardous condition(s) such as a catastrophic failure of the battery or thermal runaway. "Safety Condition" may also, or additionally, refer to a state of the battery as a function of, but not limited to, open-circuit voltage (OCV), resistance, impedance, capacity, temperature, calendar life, pressure, and historical use, any of which are associated with the battery performing at 80% or less of its theoretical power rate or energy density. For example, safety condition may also imply to a value outside a range of pre-determined values assigned to a particular battery health metric. For example, if a battery is rated by its manufacturer to have a power rate of 100 Amp-hrs at 80° C. (e.g., specifying a state of health of 100%) when fully charged, then a safety condition may also imply an OCV, resistance, impedance, capacity, temperature, calendar life, pressure, and/or historical use that is associated with 80 Amp-hrs or less at 80° C. (e.g., defining a state of health of 0%) when the battery is fully charged. For example, if a battery is rated by its manufacturer to have an energy density of 1000 W/L at 80° C., then a safety condition will also imply an OCV, resistance, impedance, capacity, temperature, calendar life, and/or historical use that is associated with 800 W/L or less at 80° C.

As used herein, the phrase "control message" refers to an information request or transmission, and may contain or have a field indicating instructions to a terminal to execute a function. For example, a control message may contain, without limitation, a message having information that may be used to determine whether cached comparison values should be updated or refreshed.

As used herein, the term "pressure sensor" refers to a device for measuring the pressure or operating pressure of a gas or fluid in a vessel or container. A pressure sensor includes, for example, a sensor such as a piezo-resistive strain gauge, a capacitive pressure sensor, an electromagnetic pressure sensor, or other commercially available pressure sensors.

As used herein, the phrase "safe-message instruction" refers to a set of instructions communicated to or from a driver or battery controller or battery management systems and which relates to a safety condition.

As used herein, the phrase "telematics device" and "telematics" is a computing device installed in a vehicle and/or BMS and the information received, sent or collected by such a device, respectively. The information includes information relevant to evaluating the health of a vehicle battery, from one or more sensors or devices within the vehicle (e.g., an ohmic tester that measures the effective resistance of the battery, a diagnostics device that monitors internal systems and ongoing operations of the vehicle, etc.). The information may be processed (e.g., by normalizing the information, removing statistical outliers, etc.) in order to generate a data set that describes the current status and conditions relating to the battery.

As used herein, the phrase "active battery pressure management," refers to a system comprising an actuator (e.g. a servomechanism) that modulates the pressure of the battery cell(s), stack, module, or pack in response to a control signal. The system can include a controller, dynamic controller or a control device, a pressure sensor, and optionally, battery sensors. The battery pressure is modulated in response to a signal generated by the controller or control device, which can be an open-loop or closed-loop controller or control device. A dynamic compressible element, e.g., piezoelectric actuator coupled to the battery, as defined and described in U.S. Application Ser. No. 62/535,744 filed Jul. 21, 2017 (hereinafter the '744 application), may be used to modulate battery pressure in response to the control signal.

As used herein, the phrase "passive battery pressure management," refers to a system comprising a spring or other device configured to modulate a pressure of the battery cell(s), stack, module, or pack, in response to a sensed change in pressure and, optionally, temperature. A passive controller, or control device refers to the device comprising the spring or other device for modulating battery pressure in this manner and including a sensor for measuring battery pressure.

As used herein, the phrase "active battery temperature management," refers to a system comprising an actuator (e.g. a servomechanism) that modulates the temperature of the battery cell(s), stack, module, or pack in response to a control signal. The system includes a heating device, such as a heat exchanger, resistive heater or inductive heater, and a controller or control device, temperature sensor and optionally, battery sensors. The heating device is located in the space occupied by the battery. The heating device modulates temperature in response to a signal generated by the controller or control device, which can be an open-loop or closed-loop controller or control device.

As used herein, the phrase "passive battery temperature management," refers to a system comprising a heating device configured to modulate a temperature of the battery cell(s), stack, module, or pack, in response to a sensed change in temperature from a sensor located outside of a space occupied by the battery, e.g., a sensor for measuring ambient temperatures.

As used herein, the term "BMS controller" refers to a controller in series with a potentiostat, a controller in series with a compressible element, a controller in series with a thermocouple, a resistive heater, a computer or electronic device which controls a compressible element, a computer or electronic device which controls a resistive heater, an inductive heater, a computer or electronic device which controls an inductive heater, a convective heater, a computer or electronic device which controls a convective heater, or similar devices for heating a battery or the area or space in which a battery is housed.

As used herein, the term "controller" refers to hardware or a device that includes, without limitation, a processor, a memory, a communications interface, and programmable logic or software. The controller may be configured to execute software; or activate/enable or deactivate/disable electrical current based on inputs received from other hardware, for example, from one device to another device.

As used herein, the term "operatively connected with," or "coupled to/with," includes having a physical, hydraulic, pneumatic, analog or digital data, electrical, magnetic, thermal, or other connection that serves to facilitate the operation of an element in conjunction with another element, or as otherwise known in the art.

As used herein, the term "program", "programmed", "computer program" or "code" refers to a set of software-based machine instructions stored in executable form, compiled or un-compiled, where un-compiled can include instructions residing as a higher-order source code in languages such as C++ or Python.

As used herein, the term "module" or "component" refers to a software file, or set of software instructions contained, or not contained in a file and existing on a non-transitory or transitory memory medium. A module may exist as a stand-alone program or represent a program called by another program. A "component" is a portion of a "module" in the sense that the module calls a component to perform a task or task(s) portion of the module.

As used herein "memory" refers to either transient computer-readable storage medium or non-transient computer-readable storage medium. In various embodiments, the volatile (transient) portion of memory may be implemented using any suitable memory technology, such as static random access memory (SRAM), synchronous dynamic RAM or any other type of memory. For the non-volatile (non-transient) portion of memory, which may comprise one or more Non-Volatile Dual In-line Memory Modules (NVDIMMs), for example, flash-based memory devices, including NAND-flash devices, may be used. In various embodiments, memristor based resistive random access memory (ReRAM), three-dimensional NAND technologies, Ferroelectric RAM, magnetoresistive RAM (MRAM), or any of various types of phase change memory (PCM) may be used at least for the non-volatile portion of system memory.

As used herein, the term "data" refers to a current or voltage signal(s), whether in analog or digital form, processed to eliminate noise, artifacts, anomalies, drift etc., or unprocessed raw data received directly from a sensor and prior to any processing to eliminate the noise, artifacts, anomalies, drift etc. Data also may refer to information contained in a database or other structured data, or unstructured data representation in transitory or non-transitory memory. Data herein may include filtered data (e.g. phase dependent data) or sub-sets of other data groups.

As used herein "processor" means one or a plurality of processors used to perform a task. A processor includes a processor of a general purpose computer.

As used herein, the phrase "control message" refers to an information request or transmission, and may contain or have a field indicating instructions to a terminal to execute a function. For example, a control message may contain, without limitation, a message having information that may be used to determine whether cached comparison values should be updated or refreshed.

As used herein, the phrase "safe-message instruction" refers to a set of instructions communicated to or from a driver or battery controller or battery management systems and which relates to a safety condition.

A "lookup table" refers to an array or matrix of data that contains items that are searched, such as discrete values of measured battery current or voltage measured over a period time, where each value for current or voltage, or voltage and temperature of a battery. Lookup tables may be arranged as key-value pairs, where the keys are the data items being searched (looked up) and the values are either the actual data or pointers to where the data are located.

The following discussion relates to methods and systems using computer and software architecture for training a battery model and using the trained battery model to predict a battery state for a vehicle. The discussion makes reference to a supervised training process for a battery model. Semi-supervised or unsupervised training embodiments for a battery model are also contemplated.

Referring to FIG. 1 there is a general flow chart depiction of software-implemented logic for training a battery model and using the trained model to predict a battery state according to the various embodiments. The battery model is defined by a plurality of features or input parameters, model parameters that are tuned or adjusted as the model learns, and at least one target or objective. A battery model may be represented by an artificial neural network (ANN) or other types of machine learning models as disclosed herein. The input parameters for the model correspond to at least one of a voltage, current, impedance, pressure, or temperature for the battery type, and the at least one target is a battery state. TABLE 2 provides examples of features or input parameters for a battery model.

The model is trained using training sets. Each training set includes values for each one of the input parameters of the battery model. In the case of a supervised training, each training set also includes a value for each of the targets corresponding to the input parameter values. The purpose of the battery model (model) is to render an accurate prediction for one or more new battery states in response to a new experience, i.e., to infer from new values for the input parameters (never experienced before) what the corresponding target value(s) is/are for the battery state, using the model's knowledge gained from the training sets.

The model is initially trained (or initialized) using an initial training set (ITS). The model may also be initialized by copying the weights and/or parameters from another trained model. Once trained using this set, the model may be used to predict a battery state when new values (or experiences) for the battery model become available. For example, an ITS contains the values for the input parameters and target values for a new battery. But as the battery ages, its properties change, which makes the ITS knowledge less useful. When certain events occur during use of the battery, the battery model is re-trained using update training sets (UTS), or the battery model is continuously trained whenever new training sets become available. The UTS may correspond to training sets generated as a vehicle is being used and after the battery has gone through several cycles of charging and discharging. TABLE 3.1, infra, provides examples of events that trigger a re-training of the battery model. In one embodiment, the UTS may be all of the data generated during operation of the battery, and the training is on-line, i.e. continuously streaming.

According to one aspect of the training process for the battery model, the values for input parameters, or the input parameters of the model itself, include parameters other than measured physical properties of the battery. Examples of these input parameters are listed in TABLE 2, infra, and reflect input parameters that are believed prominent characteristics of a battery that relate to the battery state as the battery ages. The battery model according to some embodiments is intended to map these other contemporaneous values for input parameters to the targeted battery state to produce a more accurate prediction than is possible when only a measured voltage, current and temperature of the battery is considered.

Using the trained (or re-trained model) the battery state is predicted. This predicted battery state value(s) are made available to the BMS, a user device, vehicle user interface (VUI), and/or a vehicle devices/subsystems connected over the vehicle's control area network, to help the driver or vehicle make decisions on whether to make corrections, limit power, etc. Depending on the predicted battery state, the BMS, vehicle ECU and/or vehicle operator (driver) may take certain actions like reducing the available max power to the vehicle drive train, powering down the HVAC, finding an alternative route that includes vehicle charging stations, issuing a warning of a present abnormal condition of the battery, cooling the battery, heating the battery, or producing a maximum number of driving miles available before the battery reaches 80% discharge.

According to the various embodiments, the battery model is based on the artificial neural network (ANN) type of machine learning models. Gradient boosted machine, ridge regression, lasso regression, nearest-neighbor regression, naive Bayes, support vector machine, decision trees, random forest, or ensemble methods of machine learning are also contemplated.

The battery model may, in some embodiments, comprise a plurality of battery models representing features of a secondary battery made up of several battery components. For example, a secondary battery includes several series string battery cells connected in parallel to form a battery pack for a vehicle. In this case, the battery model may include a system battery model representing features of the battery cells in their aggregate that make up the battery pack. Features of this system model would include the current and voltage seen by the vehicle powertrain, for example. The input parameters for the system model would include values representing a predicted output current, voltage, temperature, and pressure for each component model representing one of the component series string of battery cells.

The method described in FIG. 1 for training and prediction may be implemented in software running on a computing device provided with the vehicle or BMS (as described in greater detail, infra). One embodiment for code used to perform the process described in FIG. 1 may be organized in the manner shown schematically in FIG. 2. Other embodiments for the code structure are contemplated. The code may be structured differently from that described in FIG. 2 and below, depending on the number of concurrent instructions that take place during execution, input/output (I/O) demands, available memory and processing speed of the computing device that runs the code.

Figure 2:
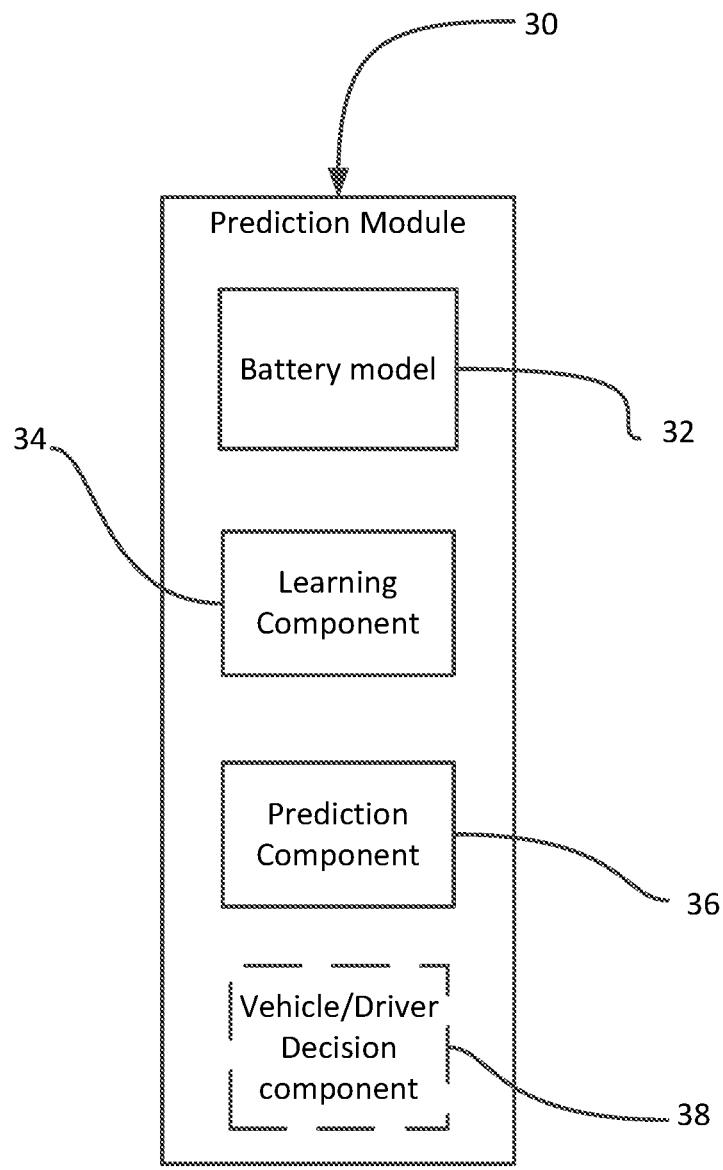
FIG. 2 is a schematic diagram of one example of software code used to perform the process described in FIG. 1.

Referring then to FIG. 2, the code associated with the battery model includes a prediction module 30 (or PM 30), which has as components or subprograms a learning component 34, prediction component 36 and, optionally, a vehicle/driver decision component 38. The code representing the most recent version of the battery model 32 is accessible to the prediction module 30.

The prediction module 30 accesses the battery model 32 from memory and calls the learning component 34 when the prediction module 30 receives a signal indicating that a re-training event has occurred. Upon occurrence of such an event, the prediction module 30 (or learning component 34) accesses from memory the data needed to construct the ITS or UTS for training the battery model. These training sets are then used to train, validate and test the battery model. Upon completion of this training process (as described in greater detail, below) a re-trained, or new version of the battery model 32 is made available. Previous versions of the battery model 32 may be stored in memory or written over with the retrained battery model.

At periodic intervals, as determined by one or more of the prediction module 30, the BMS, vehicle or driver, the prediction module 30 calls the prediction component 36, which is used to predict one or more battery states based on a new set of values for the battery model input parameters that have not been experienced before in the training sets. The new values are accessed from memory by either the prediction module 32 or prediction component 36. The prediction component 36, using the most recent version of the battery model 32, produces a prediction of the battery state using the new values for the input parameters. The predicted battery state(s) are passed to the prediction module 30, which are then stored in local memory, sent to the BMS processor for modulating a controller of the battery, and/or sent to the vehicle telematics device, for example.

In some embodiments the prediction module 30 may also include the vehicle/driver decision component 38, or decision component 38 may be a stand-alone, or separately executed module located in the vehicle. In the former embodiment, component 38 is part of the battery model and produces predicted values that depend upon the predicted battery state, e.g., whether a trip can be completed, whether the vehicle powertrain max power available needs to be limited, etc. These decision outputs are included among the targets in the battery model.

In other embodiments component 38 is a separate model (decision model) located with, e.g., a computing device for the vehicle's navigation unit or power electronics unit. The code for component 38 can be a separate learning model ("vehicle/driver model") having training and prediction components like model 32 and components 34 and 36, and receiving the predicted battery state(s) from the PM 30 as (assumed) observed value(s) for the input to the decision model. Separate vehicle/driver decision models and battery prediction modules may be desirable given the data used for the respective training sets and knowledge of the respective vehicle systems may be owned and made, respectively, by different entities, i.e., vehicle vs. battery manufacturers.

Referring to FIG. 3A, there is shown a block diagram of one embodiment of a management system for an electrochemical battery. In this embodiment all elements of the management system reside within a vehicle, such as the electric vehicle shown in FIG. 4. The system includes a computing device (device 10). The device 10 includes a processor 16 that runs the prediction module code 30 and accesses data 11 used by the battery model. The device 10 is connected to the BMS 210, BMS processor 228 and/or BMS memory 226 for access to data stored thereon relating to values for input parameters to the battery model. The device 10 may also be connected directly to sensors/controllers 209 associated with the vehicle's battery 208. Device 10 may be separate from the BMS 210, or part of it. As drawn, device 10 is separate from the BMS 210.

BMS sensors/controllers 209 generate data relating to physical characteristics of the battery 208, such as temperature, voltage, current, pressure, etc. BMS sensors/controllers 209 also refers to data generated by, or relating to vehicle subsystems that draw a load current from the battery 208 and are directly controlled by the BMS (these vehicle subsystems are described in greater detail in connection with FIG. 5, infra). Such physical characteristics may include, without limitation, measured pressures, voltages, currents, and temperatures of the battery 208. The data is provided by the respective BMS controller that controls a sensor, and/or a standalone sensor and processor 226. The data received by the BMS 210 from the sensors/controllers 209 may be raw, i.e., unprocessed, data. In this case the BMS 210 processor 226 processes the data to remove signal noise, drift, etc. The device 10 reads the processed data from BMS memory 228 into its own memory 12, either periodically or whenever values for battery model input parameters are needed (for training or to make predictions). Alternatively, the raw/unprocessed sensor and controller 209 data may be sent directly to memory 12.

In some embodiments, data originating from sensors/controllers 209 is continually stored in memory 228 and/or memory 12 for the most recent two weeks, or month prior. The data is typically stored as a time series with a sampling rate sufficient to capture current spikes produced while the vehicle is being driven.

The device 10 is connected to other data 50 through the device 10 network interface 18. Other data 50 may not be available from the BMS, such as vehicle data relating to the state of the vehicle powertrain or regenerative braking system (essentially, data relating to such things as the electrical-mechanical efficiency of systems that move or stop the vehicle) and the vehicle's navigation system. Other data 50 may also include data available over a wireless network (e.g., internet/cloud), such as environmental conditions (temperature, relative humidity), traffic, battery or motor control updates and software updates. Other data 50 may also include driver/passenger data located on a mobile device, e.g., trip information, driving preferences.

Network interface 18 connects via a wired network to other vehicle devices 60, e.g., telematics device accessible over the vehicle's control area network. Network interface 18 may also include a wireless connection capability to a network 61 for accessing other devices 62, such as a mobile device, or a server hosting a vehicle and/or battery manufacturer resources site. The vehicle and/or battery manufacturer resources made available from the server may provide updates to the battery or the vehicle relating to state of battery predictions, and software updates such as cyber security patches. Battery or vehicle manufacturer resources also may include values for input parameters to the battery model, such as values used for the ITS.

Device 10 is a general-purpose computing device. Device 10 includes one or more processors 16 coupled to memory 12 via an input/output (I/O) interface 14. Device 10 further includes the network interface 18 coupled to I/O interface 14. In various embodiments, device 10 may be a uniprocessor system including one processor 16, or a multiprocessor system including several processors 16 (e.g., two, four, eight, or another suitable number). Processors 16 may be any suitable processors capable of executing instructions. The processors may be custom ASICs, CPUs, GPUs, tensor processing units, or other processor architectures. For example, in various embodiments, processors 16 may be general-purpose or embedded processors implementing any of a variety of instruction set architectures (ISAs), such as the x86, PowerPC, SPARC, or MIPS ISAs, or any other suitable ISA. In multiprocessor systems, each of processors 16 may commonly, but not necessarily, implement the same ISA.

Memory 12 stores code 30 and data 11 accessible by the processor(s) 16. Memory 12 may comprise both volatile and non-volatile portions; in other embodiments, only volatile memory may be used. Code implementing one or more desired functions, methods or techniques described above in connection with FIGS. 1 and 2 and below in connection with the detailed description of battery models according to the various embodiments, is depicted as residing within memory 12 as code 30.

I/O interface 14 coordinates I/O traffic between processor 16, system memory 12, network interface 18, or other peripheral interfaces such as various types of persistent and/or volatile storage devices. I/O interface 18 may perform any necessary protocol, timing or other data transformations to convert data signals from one component (e.g., memory 12) into a format suitable for use by another component (e.g., processor 16). In some embodiments, some or all of the functionality of I/O interface 14, such as an interface to system memory 12, may be incorporated directly into processor 16.

Network interface 18 may be configured to allow data to be exchanged between device 10 and other vehicle devices 60 or other devices 62 attached to a network or networks 61, such as other computer systems or devices. Network interface 18 may support communication via any suitable wired or wireless general data networks, such as types of Ethernet network, for example. Additionally, network interface 18 may support communication via telecommunications/telephony networks such as analog voice networks or digital fiber communications networks, via storage area networks such as Fiber Channel SANs, or via any other suitable type of network and/or protocol.

Figure 3B:
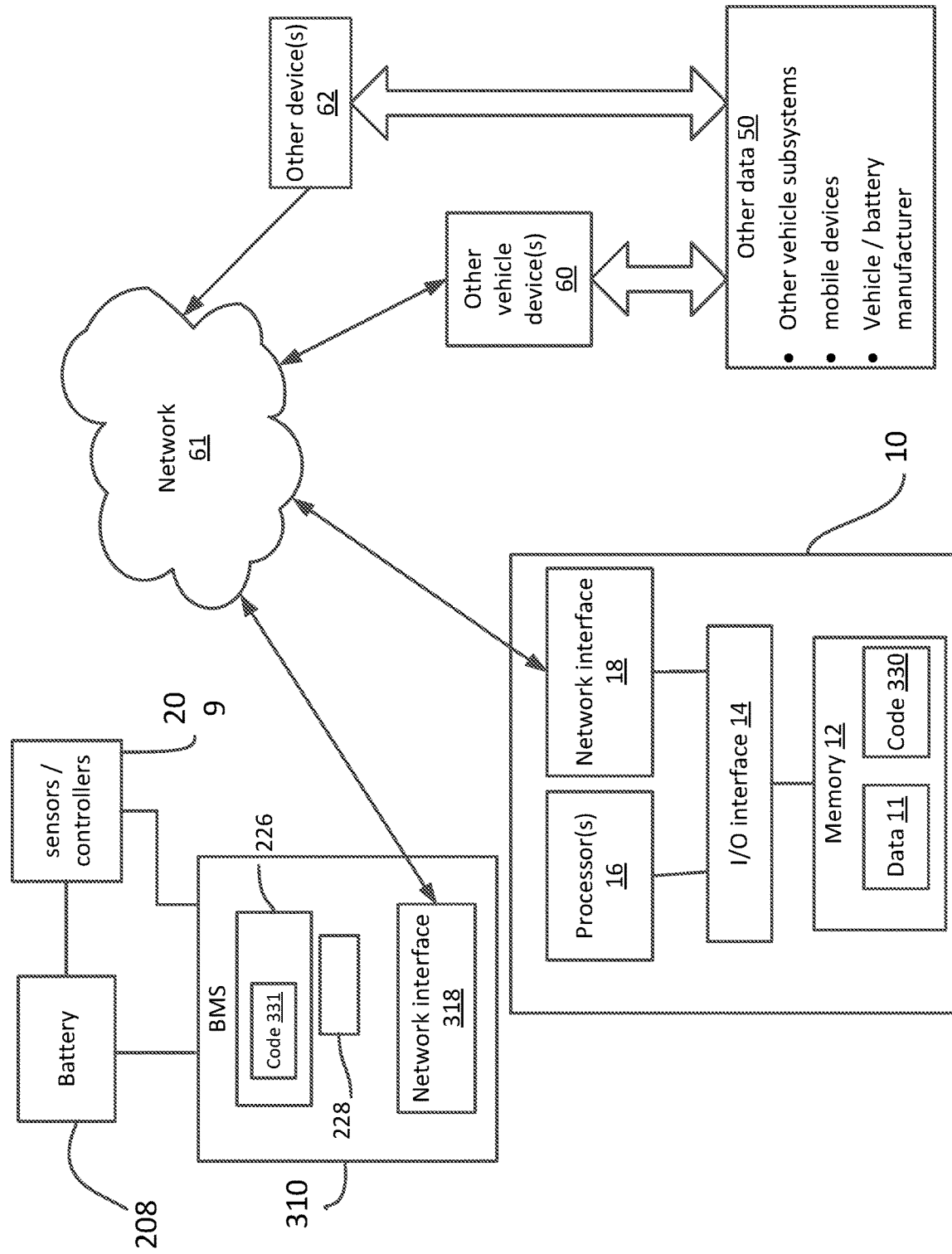

FIG. 3B is a block diagram of another embodiment of a management system. This embodiment shares much of the same characteristics as the embodiment described in connection with FIG. 3A. In FIG. 3B the computing device (device 10) is located remotely over a wireless network rather than onboard the vehicle (the same element numbering between FIG. 3A and FIG. 3B means the same description applies).

In some embodiments, the prediction model 30 may reside entirely at the remote device 10, in which case the vehicle receives predictions on the battery state, and vehicle/driver decisions remotely. In other embodiments, the learning component 34 and prediction component 36 reside remotely at device 10 and only the driver/vehicle decision component 38 is online with the vehicle (executed by an ECU processor, for example, or BMS processor 228). According to the later embodiments, all computations associated with predicting a battery state are handled remotely, and only the vehicle/driver decision-making computations are handled onboard the vehicle (using the battery state prediction computed remotely).

In another embodiment, the learning component 34 resides at device 10, while the prediction components 36, 38 reside with the vehicle. This embodiment is indicated in FIG. 3B by code 330 portion of module 30 located at device 10 and code 331 portion of module 310 located at BMS memory 226. Code 330 includes the battery model 32 and learning component 34, and code 331 includes the prediction component 36 and vehicle/driver decision component 38. The device 10 receives the UTS data from the vehicle and updates model parameters by running the learning component 34 on processor 16. The BMS 310 receives periodic updates to the model parameters generated by device 10 (based on the uploaded UTS from the vehicle). These updated model parameters are downloaded and replace those used in the previous model version. Processor 228 executes the code 36, 38 for making online battery state and vehicle/driver decision predictions using the updated model parameters received over the network.

Training data generated by BMS sensors/controllers 209 are communicated by the BMS 10 via a network interface 318 portion of the BMS 10. Or the data may be communicated over the vehicle's control area network (CAN) to a telematics unit, which then makes the data available to the device 10. The data uploaded from the sensors/controllers 209 may be raw, i.e., unprocessed, data, or cleansed/processed data to remove signal noise, drift, etc. Data originating from sensors/controllers 209, other devices 62, and other vehicle devices(s) 60 may be automatically uploaded to device 10 memory 12 whenever there is sufficient bandwidth available, or at pre-designated times (i.e., nightly, weekly, during recharging, etc.). Sensor/controller 209 data, and other data 50 from vehicle devices or systems 60 and other devices 62 may all be uploaded to device 10 using the vehicle's telematics unit (not shown).

Figure 4:
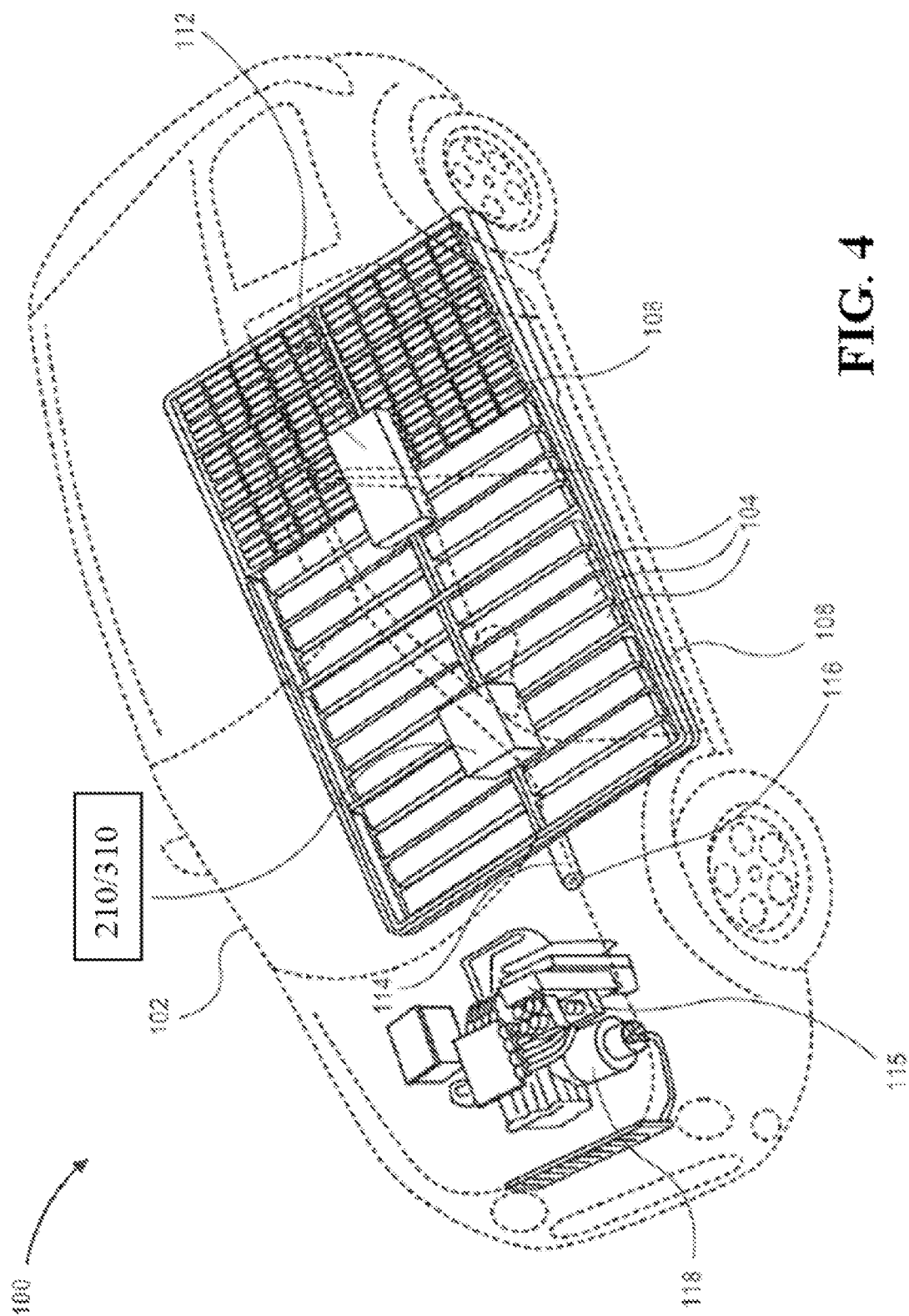
FIG. 4 is a perspective view of a battery system, powertrain and BMS for an electric vehicle.

FIG. 4 illustrates an electric vehicle 100 with transmission and electric motor 118 and power electronics 115. A range display, or "fuel gauge," may be displayed to a driver or passengers on a dashboard or shared display. Multi-cell battery pack 208 is located under the floor of the vehicle. Battery pack 208 includes rechargeable solid-state battery cells 104. Battery pack 208 may, in some examples, also includes power cells 106 that are of different battery chemistry than solid-state battery cells 104. In some embodiments, power cells are optional elements and not necessary. In some examples, power cells can be substituted with additional battery cells, such as battery cells 104.

Solid-state battery cells 104 are shown in the figure as long rectangular blocks for line drawing reproducibility but are in actuality hundreds of small rectangular cells. Cells 104 have a conversion chemistry cathode. Conversion chemistry cathodes can include those using iron fluoride, copper fluoride, nickel fluoride, or other suitable conversion chemistry materials.

Power cells 106 have a lithium nickel mangangese cobalt oxide chemistry cathode active material. In alternative embodiments, solid-state battery cells 104 can have intercalation chemistry cathodes, and power cells 106 can have lithium nickel mangangese cobalt oxide cathodes. Other battery chemistries are envisioned and would be apparent to one of skill in the art including NCA (Li(NiCoAl)$O_2$), LNMO (LiNi$_{1-x}$Mn$_x$O$_y$, wherein x is from 0 to 1 and y is from 0 to 2), etc. Power cells 106 may also include hybrid combinations of conversion chemistry and intercalation chemistry cathode active materials.

Battery pack 208 is connected to the rest of the vehicle through high-voltage electric cable 114. Solid-state battery cells 104 have a terminal voltage that can be measured at terminals 116 on cable 114 or in other suitable tap areas. Terminal voltages can be measured on individual cells as well as for the overall battery pack. The terminal voltage and/or other sensor inputs are input into the BMS 210. BMS 210, in turn, controls at least the battery thermal management system 112 and may also control or modulate other load device controllers.

Figure 5:
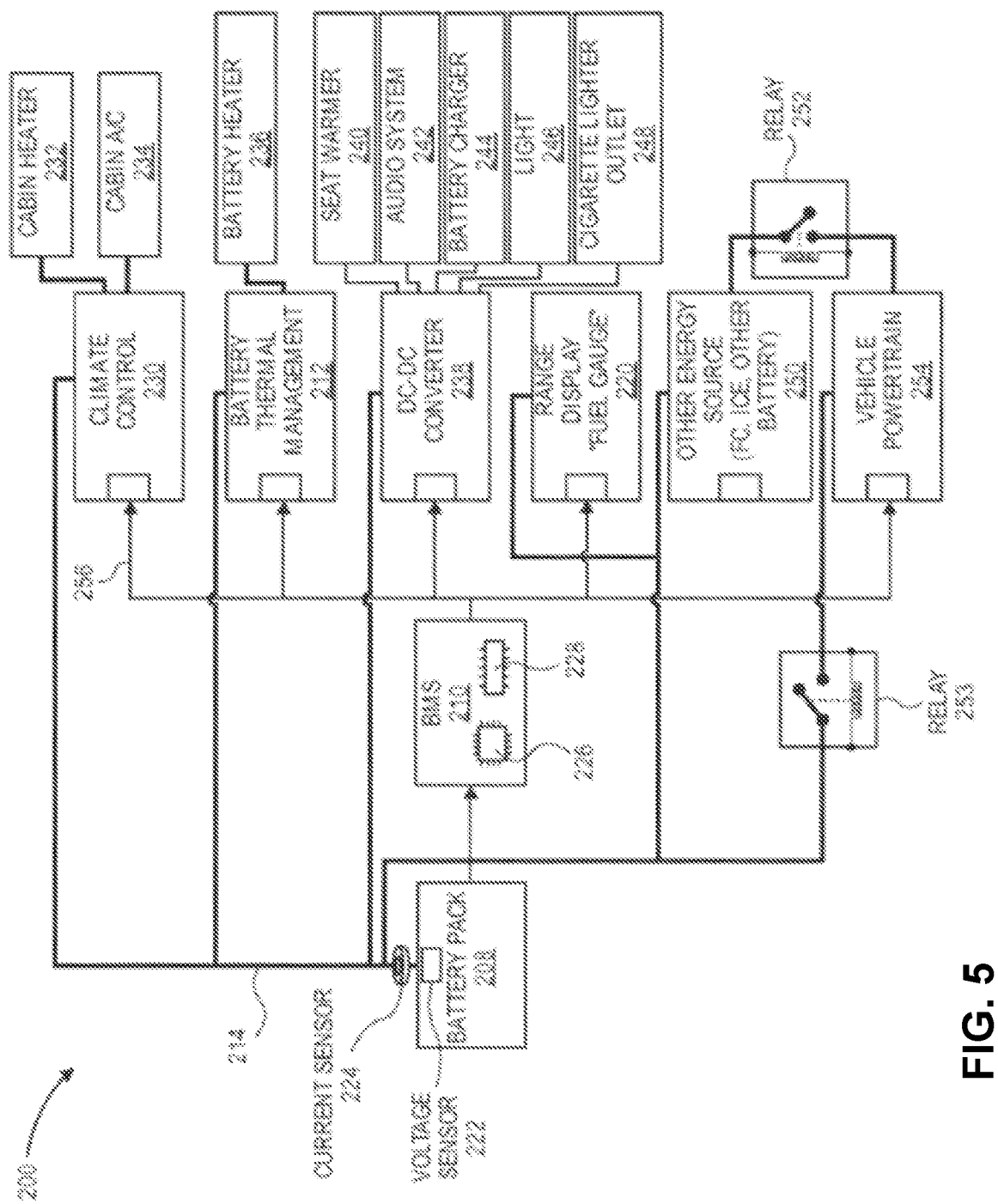
FIG. 5 is a simplified electrical system schematic of the vehicle in FIG. 4.

FIG. 5 is a simplified electrical system 200 schematic for the vehicle 100. In system 200, battery pack 208 is connected by high voltage lines 214.

An example of sensors/controllers 209 is terminal voltage sensor 222 and current sensor 224. Voltage sensor 222 measures the loaded voltage of battery 208, while current sensor 224 gauges (i.e., measures) load current to and from battery 208. Outputs from voltage sensor 222 and current sensor 224 are sent to battery management system (BMS) 210 and may also be sent directly to the computing device 10, which runs the prediction module 30.

As noted earlier in connection with FIG. 3, BMS 210 includes processor 226 and memory 228. Memory 228 is operatively connected via a high speed bus to processor 226 so that its memory can be addressed by computing elements in processor 226. Other peripheral systems, such as a processing acceleration unit and wireless communications subsystem can be connected as well to processor 226.

Processor 226 controls the operation of battery management computer system 210. One or more processors may be included in processor 226. These processors may include single core or multicore processors. In certain embodiments, processor 226 can be implemented as one or more independent processing units with single or multicore processors included in each processing unit. In other embodiments, the processor can also be implemented as a quad-core processing unit formed by integrating two dual-core processors into a single chip. Embodiments of processor 226 and memory 228 for BMS 210 include those listed above for computing device 10 processor(s) 16 and memory 12, respectively.

Processor 226 can execute different programs in response to BMS code and, in some configurations, can maintain multiple concurrently executing programs or processes, including the prediction module 30. At any given time, some or all of the program code to be executed can be resident in processor 226 and/or in memory 228.

BMS 210 communicates with various load device controllers through communication line 256. A signal can be sent, or stopped from being sent, to one or more load device controllers, such as those for climate control system 230, battery thermal management system 212, direct current (DC)-to-DC converter 238, other power or energy sources 250, and/or vehicle powertrain 254.

Climate control system 230 includes cabin heater 232 and cabin air conditioner (A/C) 234. It can be signaled by battery management system 210 to temporarily cease, for example, an air conditioning compressor. Battery thermal management system 212 can be signaled to turn on battery heater 236 so that the cells in battery pack 208 come to a more optimal battery temperature. It can also signal to cool the cells in battery pack with a refrigerant, solid-state piezoelectric cooling, etc. DC-DC converter 238 can be signaled to remove or add power to seat warmer 240, audio system 242, auxiliary battery charger 244, cabin light, running light, fog light, or headlight 246, and/or mobile device recharger outlet 248. Range display 220 can be updated as well.

In some embodiments, the battery cells are actively heated. In other embodiments, the battery cells are actively cooled. In some embodiments, the battery cells can be both actively heated and actively cooled. In some embodiments, a battery management system, such as BMS 210, can temporarily cease, turn on, modulate, or limit the active heating/cooling system based on the battery model's predicted state of the battery. Embodiments of active/passive heat exchangers for a battery and methods for implementing such devices, and the controller data associated with operation of the heat exchangers are provided in US20160059733.

In some embodiments, the battery cells are actively pressurized. In other embodiments, the battery cells are actively de-pressurized. In some embodiments, the battery cells can be both actively pressurized and actively de-pressurized. In some embodiments, a battery management system, such as BMS 210, can temporarily cease, turn on, modulate, or limit the pressurization systems based on the battery model's predicted state of the battery. Embodiments of active/passive pressurization devices for a battery and methods for implementing such devices, and the controller data associated with operation of the pressurization devices is provided in the '744 application). If a large burst of power is required, an alternative power source 250, such as a fuel cell (FC), internal combustion engine (ICE), or auxiliary battery can be placed into service. Relay 252 or 253 can connect alternative power source 250 to vehicle drivetrain 254. Power can be shunted to the rest of the vehicle by high voltage line 214. Vehicle drivetrain 254 may be signaled to preserve power by shifting to a lower or higher gear, adjusting speed, or other measures.

Example

In one illustrative example, a model was constructed to predict the battery voltage response to a changing current demand. This model output would be used by the BMS to calculate available power. The input current was chosen to be an increasing ramp of square waves with amplitude from 1 mA/cm$^2$ to 10 mA/cm$^2$ of charging and discharging pulses. Battery cell voltage response was recorded for two conditions: first near beginning-of-life conditions, when the cell has reasonably low resistance. Second, near end-of-life conditions, when the cell has higher resistance and modified capacitance.

A Random Forest (RF) model was used to predict an output voltage. The features of the model were current, I(t), and voltage, V(t) at different time points "t". TABLE 1 below summarizes the 17 input parameters used for this model. The objective or output prediction for the model is the battery voltage at time to. Time points are represented as time $t_0 \ldots t_{-500}$ representing time points within the last 500 measured time points. For example, $I(t_{-2})$ is the current at time $t=t_{-2}$.

TABLE 1

| Random Forest Model input parameters | |
| --- | --- |
| $I(t_0)$ | |
| $I(t_{-1})$ | $V(t_{-1})$ |
| $I(t_{-2})-I(t_{-1})$ | $V(t_{-2})-V(t_{-1})$ |
| $I(t_{-6})-I(t_{-1})$ | $V(t_{-6})-V(t_{-1})$ |
| $I(t_{-14})-I(t_{-1})$ | $V(t_{-14})-V(t_{-1})$ |
| $I(t_{-34})-I(t_{-1})$ | $V(t_{-34})-V(t_{-1})$ |
| $I(t_{-85})-I(t_{-1})$ | $V(t_{-85})-V(t_{-1})$ |
| $I(t_{-206})-I(t_{-1})$ | $V(t_{-206})-V(t_{-1})$ |
| $I(t_{-500})-I(t_{-1})$ | $V(t_{-500})-V(t_{-1})$ |

Thus, a learning model (in this example a "Random Forest") was trained to predict the voltage at time $t_0$. Other ensembles of learning models, such as an ensemble of neural networks, having the same or similar number and type of features as the Random Forest used to generate the results herein may also be used.

Figure 6A:
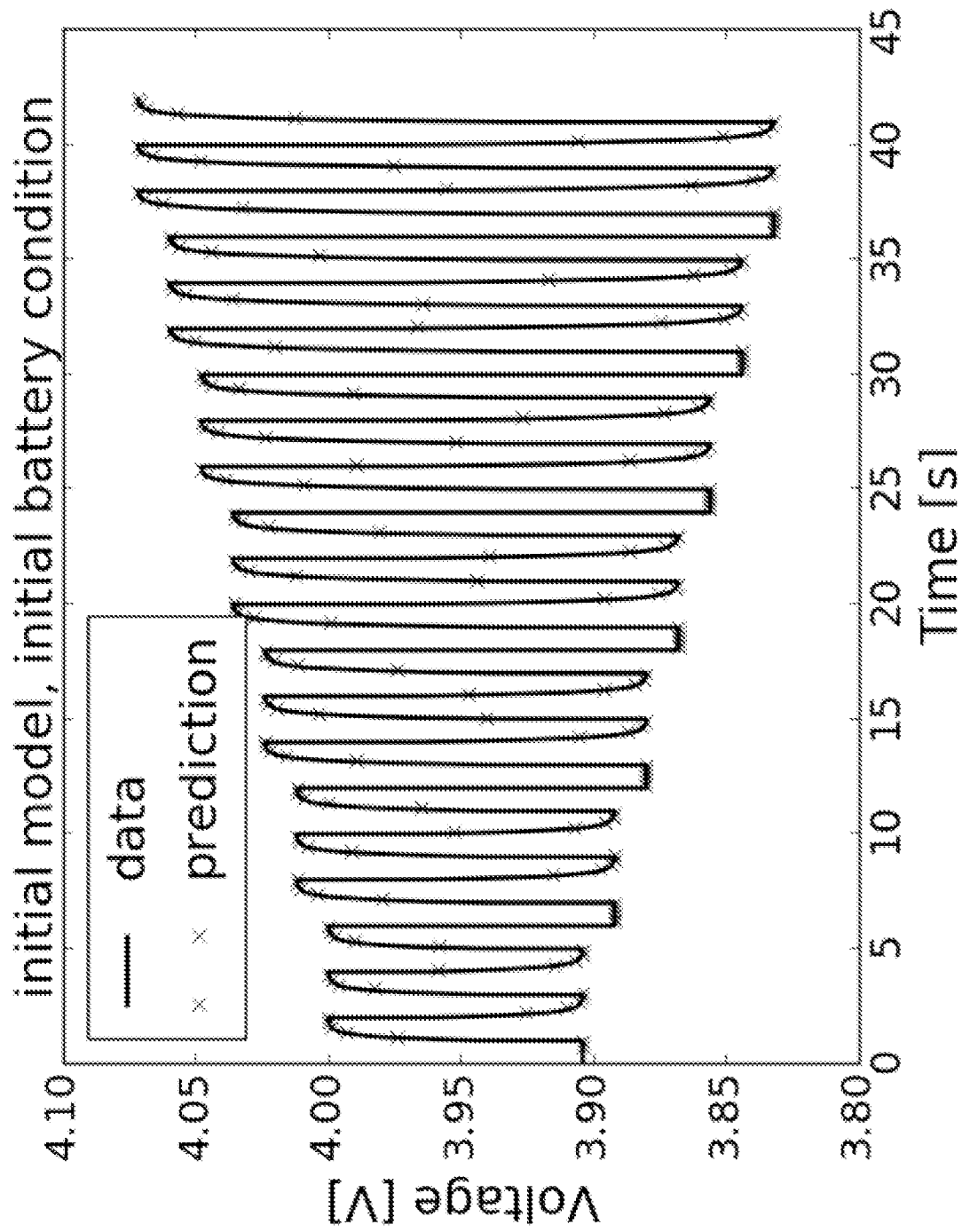
FIG. 6A is a plot showing predictions of battery cell voltages versus time for a new battery cell. The solid lines show the actual (measured) voltages vs. time, in response to a predetermined charging and discharging current applied to the battery. The predicted voltage values using the trained model are indicated by "x." The voltage predictions were generated using a trained Random Forest model, trained from an initial training set (ITS) of battery currents and corresponding voltages for the new battery cell.

Supervised learning was used to train the model. The Initial training set (ITS) included values for the 17 input parameters and known output $V(t_o)$ value corresponding to those input values. The results of the model fit compared to cell data is shown in FIG. 6A. It can be seen that the model as formulated provides a good prediction of cell voltage, showing that this type of predictive model can be useful to predict available power for the BMS.

Figure 6B:
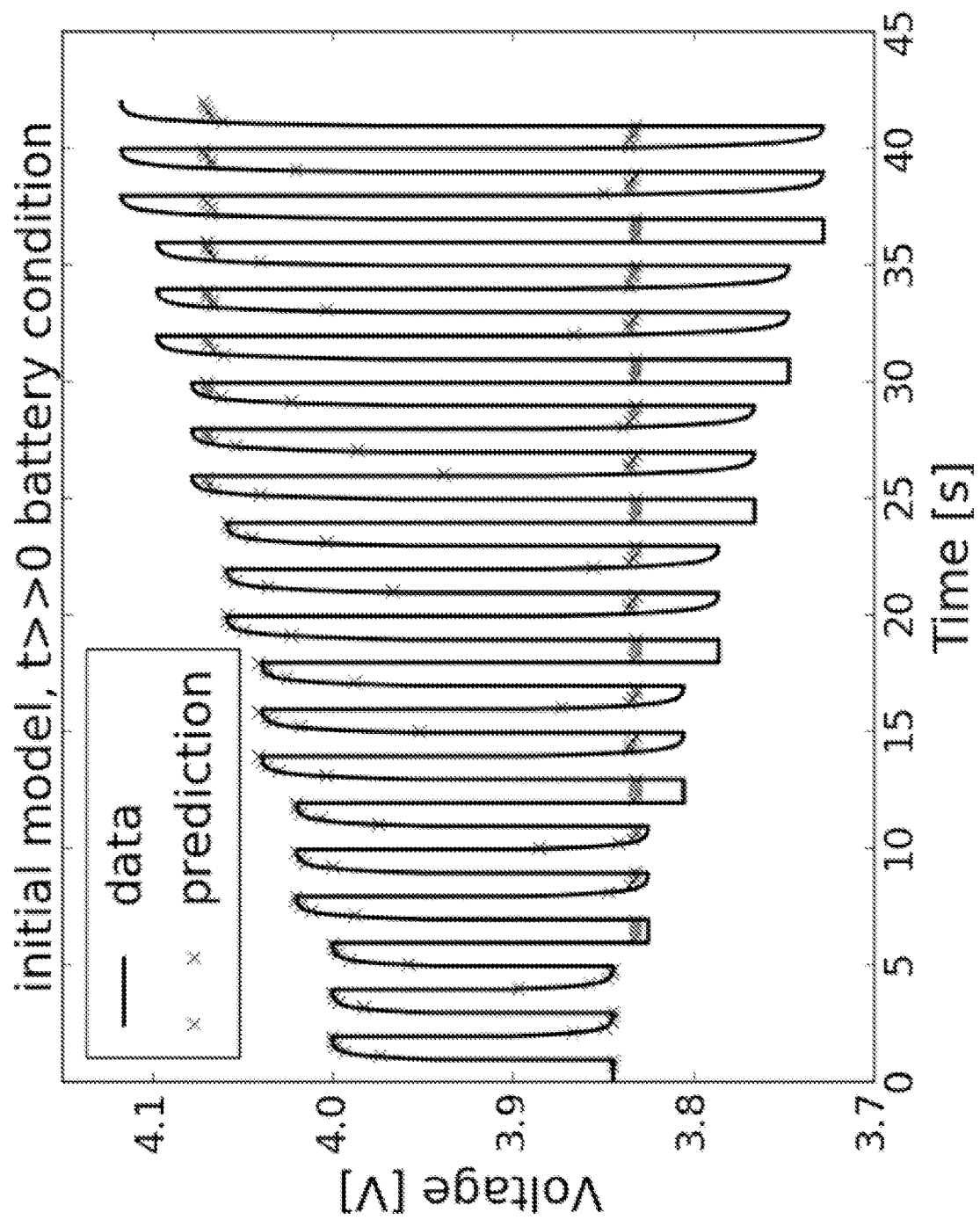
FIG. 6B is a plot showing predictions for battery voltage using the model trained from the ITS as in FIG. 6A, but used to predict voltages for the battery cell after it has aged.

The same model (trained only on the ITS) was applied to a cell after ageing and resistance growth; the model predictions are shown in FIG. 6B. It can be seen that the model does not give accurate predictions of voltage, showing that cell ageing negatively impacts the ability of the BMS to predict available power, especially for high power demand.

Figure 6C:
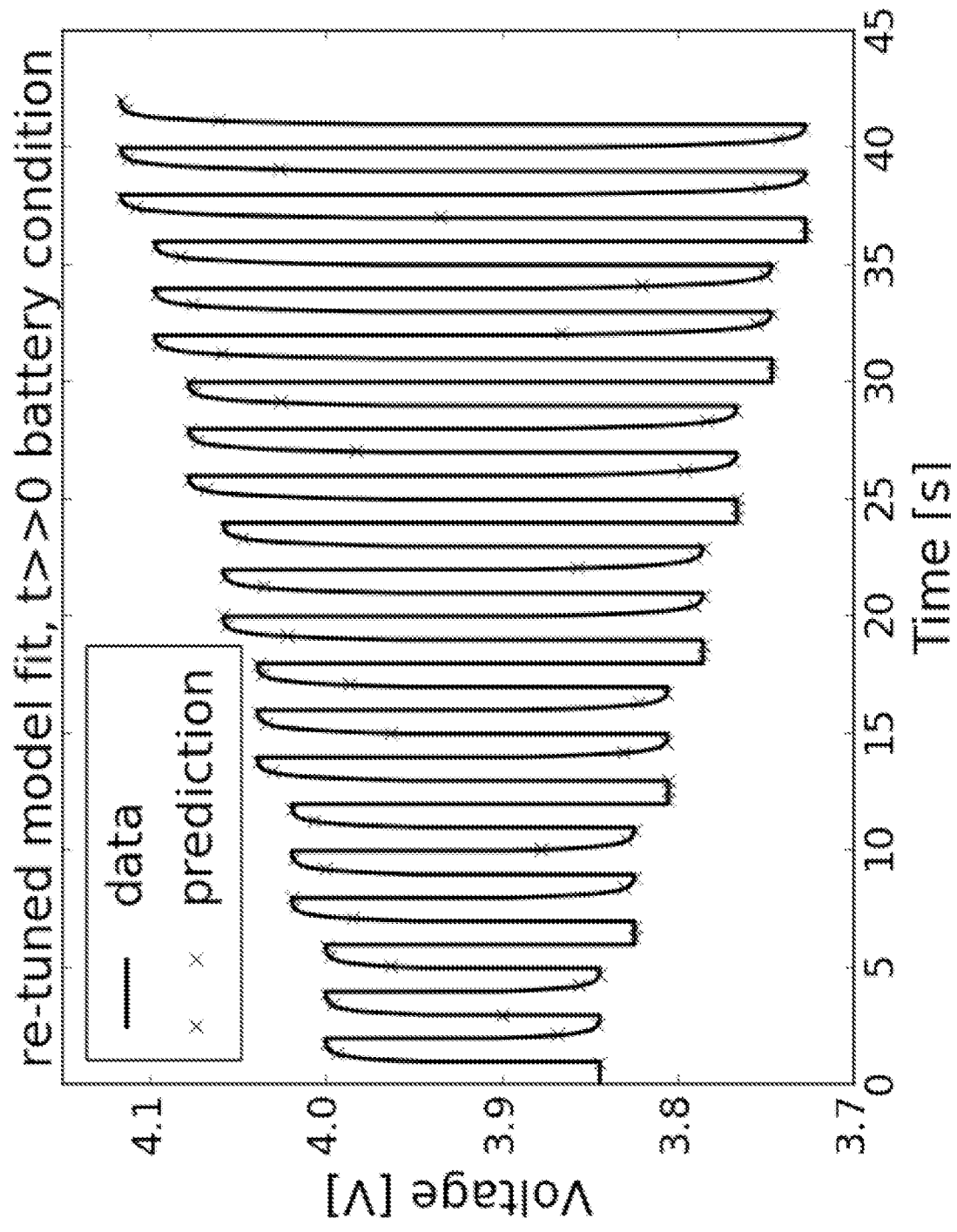
FIG. 6C is another plot showing predictions for battery voltage for the aged battery after the model from FIG. 6A is updated using an updated training set (UTS) for the aged battery. The updated model is more accurate in its predictions of battery voltage for the aged battery, as can be seen by comparing FIG. 6B with FIG. 6C.

Next, the model was retrained (or retuned) using an updated training set (UTS) assembled from aged battery data. This updated model was then used to predict voltages from current values not previously experienced by the model. The updated model was more accurate at predicting battery voltage for an aged battery than the model version trained only on the ITS. A comparison of the voltage predictions versus the actual voltages for the aged battery is shown in FIG. 6C.

In a preferred implementation, this battery model for the battery cell is retrained whenever a new training set becomes available, i.e., second-by-second while current is being drawn from, or delivered to the cell (discharging/charging of the cell). Thus, every measured data point from the battery gets fed back into the model to allow continuous retraining of the model. Mini-batch training may be used instead of online training.

For this model deployed onboard vehicles, more input parameters may be used, for example cell temperature, ageing parameters, and parameters that capture internal behavior of the battery, such as resistor and capacitor values. TABLE 2, infra, lists examples of additional input parameters that may be included in the battery model of TABLE 1. Additionally, or alternatively, this battery model may represent the current and voltage of a single battery cell or battery system model (comprising e.g., a series string of cells).

The output predictions from the model may be provided as an input parameter to a vehicle/driver decision model. Examples of input parameters for a vehicle/driver decision model to include with the output from the battery model described in TABLE 1 are provide in TABLE 3, infra.

The example illustrated in FIGS. 6A-6C shows that a static model (i.e., a model that is not retrained after the battery has aged) is inferior to an adaptive or updated model at predicting battery power availability after battery ageing.

Other Battery Models

According to embodiments disclosed herein, a battery model predicts a SOH, available power, SOC, voltage in response to a current demand, etc. and related battery states that are not observable (i.e., a battery state that cannot be directly measured, or is never truly known, but instead only predictable or inferable in terms of other observable data such as a measured voltage and current). A battery model according to the embodiments may be a domain-specific battery model or a domain-general battery model.

A "domain specific battery model" (DSBM) makes predictions on battery states specific to a battery assembly and vehicle that uses the battery. The battery model is trained from empirical data for only a specific type of battery system, i.e., the specific type of arrangement of battery cells, coupling or connectivity among cells, thermal properties of the housing for the battery pack, container and cells, the electrical coupling or connectivity among cells and the cell chemistry, as well as the type of vehicle that charges/discharges the battery over the battery's lifetime.

A "domain general battery model" (DGBM) is trained from empirical data gathered for more than one type of vehicle that generates a drive torque from energy stored in a chemical battery. For example, the battery model is trained using data gathered from several different externally-charged electric vehicles that use a solid-state lithium-ion secondary battery.

A battery model (or models) may also represent a hybrid of domain-specific and domain-general battery model. The battery model may be specific to the type of battery installed in a vehicle, but model parameters associated with the vehicle systems serviced by the battery may apply to several different types of vehicles of similar class or powertrain design. Or the battery model may be specific to the vehicle class or powertrain design, but the model parameters associated with the battery may be common to a variety of battery types having the same basic battery chemistry, i.e., any Li-ion secondary battery.

The data used to train the battery model; that is, features of the battery model represented in a training set may, in some embodiments, be the same between a DGBM and DSBM. Thus, where model features are the same, the DGBM and DSBM differ in respect to where the initial training set (ITS, see below) originates, and how the model is validated and tested based on this ITS. In other embodiments, the DGBM and DSBM will have a different number or type of features in the training data. For example, the DSBM training data includes temperature, voltage, current and pressure sensors for each individual series string of battery cells, whereas the data input for temperature, voltage, current and pressure in the DGBM is limited to temperature, voltage, current and pressure values representing aggregate, or net values for multiple serially connected battery strings connected in parallel.

Following are examples of a battery model according to the disclosure, which applies to embodiments of DSBM and/or DGBM. The domain is a solid-state, Lithium-Ion secondary battery for an electric automobile of the type described in U.S. Pat. No. 9,393,921 and described above in connection with FIG. 4 and FIG. 5. The battery model predicts various battery and battery-related parameters as the battery is charged and discharged over its lifetime.

In the following examples of a battery model, the description refers primarily to a prediction for SOC; however, the description applies equally to predictions of other battery states using a battery model, e.g., impedance, SOH, which are never observable (meaning there is no way to directly measure the value; rather, it can only be predicted based on other measured battery properties and, typically, only after disconnecting the battery from the vehicle and running extensive tests on it). Additionally, the examples refer to an implementation of an Artificial Neural Network (ANN) or Random Forest formulation of the battery model. The battery model is trained using supervised training. Thus, the ITS and UTS have both input parameters and targets for training the battery model.

The data for the initial training sets (ITS) for the battery model may be obtained from testing or prior vehicle use of batteries. The ITS may include both new and used battery data from batteries other than the one that will be installed in the vehicle that makes use of the battery model. Referring to SOC, the target value for the ITS may be 10% SOC, 20% SOC, and the input parameters associated with each of these targets is the contemporaneous values of the input parameters. The values for SOC for the TS, e.g., 10% SOC of as-rated intervals, is obtained by fully discharging the battery (at low, medium and high discharge rates) while measuring the corresponding changes in current, voltage, and temperature. The measured current, voltage and temperature are the values used for the input parameters associated with the measured SOC intervals.

In some embodiments, the battery is fully discharged using a simulated battery discharge and regenerative charge sequence that represents different driving conditions or driving patterns. The current and voltage is sampled at a relatively high sample rate to ensure all peaks are captured, e.g., every 0.01 second. The ITS may include training sets that represent battery states before it is ever used, i.e., 100% charge=100% of as-rated charge, and under a range of battery temperatures and discharge rates. In some embodiments the ITS can also include training sets for equivalent aged batteries. For example, a car or battery manufacturer can subject an identical vehicle/battery to the different discharge rates/driving scenarios for batteries previously cycled 100, 200, 300 etc. times under different environmental conditions.

The UTS is used to retrain the model in a supervised learning fashion using known quantities for the targets when the targeted battery state is directly observable or measurable, e.g., whether a trip was in-fact completed based on a prediction made before the trip started, or whether a measurable battery pressure or temperature is accurately predicted in advance of an event (e.g., when the vehicle will be driven). Thus, for battery model targets eventually observable, the observed targets are paired with the input parameters to make UTS for predicting future values of those targets.

For SOC the target is never directly observable or measurable unless the battery is fully discharged. One therefore needs to devise a way for producing supervised training sets, or use some other methodology for obtaining the UTS for SOC as the battery ages. More specifically, one needs a method for generating the UTS using the real-time or contemporaneously gathered data from the automobile that can be translated into a target value for SOC.

Known methods for predicting SOC for a Lithium-Ion battery estimation compute its value from a measured loaded terminal voltage, battery temperature and current provided by sensors. Typically, the SOC is estimated based on current and temperature, and the terminal voltage is used as a feedback parameter for making corrections to the SOC prediction, such as prediction generated from a neural network. See e.g. U.S. Pat. No. 7,583,059. Alternatively, the BMS may interpolate SOC values from a lookup table stored in memory. The lookup table lists SOC as a function of temperature, voltage and rate of discharge. Alternative methods include solving for SOC using equivalent circuit models, e.g. U.S. Pat. No. 9,393,921 to QuantumScape Corp. (estimates SOC using a system of coupled linear equations derived from an equivalent circuit model of a battery cell). Other methods may rely on fuzzy logic or a Kaman Filter for estimating SOC. E.g., Paschero et al., A novel mechanical analogy based battery model for SoC estimation using a multi-cell EKF, IEEE (14 Jan. 2016) (SOC estimate uses Extended Kalman Filter (EKF) with battery model derived using analogous mechanical system).

One drawback of these known methods for estimating SOC is that they do not adequately take into account the various other factors that can greatly influence the SOC as the battery ages. While it is known that a great number of factors can influence the SOC for an aged battery, heretofore the prior art has not provided a satisfactory solution to how to incorporate these other factors into a battery model, in order to improve the accuracy of SOC prediction for an aged battery. Instead, the prior art has made assumptions about the battery's SOC after it has gone through several "duty cycles"—the intermittent loading of a battery by the vehicle. While the known methods for predicting SOC estimate the SOC based on contemporaneous measurements of voltage, current and temperature, there is typically no additional, contemporaneous input parameter taken into account. As a consequence, the known prior methods' predictive capabilities become less and less accurate as a battery ages. The methods employed according to the various embodiments of invention disclosed herein address these drawbacks in the prior art.

In one embodiment SOC for a UTS is predicted using a formula or lookup table based on, e.g., a measured current, voltage, temperature, rate of discharge-charge, pressure change for the vehicle (as provided by the ECU, telematics device, and/or onboard battery sensors). This estimated value for SOC is paired with the other input parameters for UTS, which is then used to train a model for predicting SOC.

In a broad sense, input for a battery model comes in two types: input from sensors measuring a physical state of a battery and input not originating from one of these sensors.

Battery sensor input data for a prediction model may include one or more of actual battery cell temperatures, load currents, and loaded terminal voltages. The input parameters from the battery include temperature received from a temperature sensor within or proximate to the battery, a load current from the battery, and a loaded voltage or open circuit voltage. Sensor data may be obtained from one or more of, or a combination of a measured voltage, current, impedance, pressure, or temperature of a battery cell, a stack of battery cells, a pouch comprising battery cells, a can comprising battery cells, a module comprising cans, a battery pack, multiple batteries in a series connection, multiple batteries in a parallel connection, multiple serially connected battery strings connected in parallel, and multiple parallel connected battery strings connected in series.

A battery state prediction may additionally be based on input not based on a sensor measuring a physical state of the battery. Such input may be selected from the group consisting of past battery warming conditions, past vehicle performance conditions, past battery performance conditions, ambient temperature, vehicle temperature, and a relationship between two or more of the available power of a battery, temperature of the battery, state of charge of the battery, and age of the battery.

Input parameters that may also be part of a battery model are found in US20160059733 and the '744 application.

Examples of input parameters for battery models according to the disclosure are summarized in TABLE 2. According to the embodiments a specific battery model may include as an input parameter all of the input parameters listed in TABLE 2, or only a portion of these input.

TABLE 2

Summary of Input/features and Domain for a Battery Model

| Type | Source for information | Related input/features | How used |
|---|---|---|---|
| Battery repair, system servicing and warning events | BMS memory, cloud storage, vehicle telematics; Battery or vehicle manufacturer/ supplier associated with vehicle identification number (VIN) | Past number of repairs or safety conditions/warnings issued, and last battery service date; | UTS, ITS, model bias |

TABLE 2-continued

Summary of Input/features and Domain for a Battery Model

| Type | Source for information | Related input/features | How used |
|---|---|---|---|
| Cell chemistry/cell construction | Battery or vehicle manufacturer/supplier | Details about battery cell construction, other than general chemistry (e.g. Lithium-Ion battery) | Domain-specific battery model (DSBM) formulation |
| State of Battery/Battery State | vehicle manufacturer/supplier; and previously observed or estimated from observable quantities | SOC, SOH, power available, energy available, energy available with respect to a planned route, presence of a safety condition, presence of a repair condition, battery life, battery temperature, battery voltage, battery impedance, or battery cell pressure | UTS, ITS training targets |
| External charging | External charger-supplied metrics, BMS, telematics | charge rate exceeds recommended maximum charge rate, over-charging events and temperature changes during and shortly after charging, | UTS, ITS |
| Battery pack assembly, circuitry, etc. | Battery or vehicle manufacturer/supplier | battery cell, stack of battery cells, pouch comprising battery cells, can comprising battery cells, module comprising cans, and battery pack. | Domain-specific battery model (DSBM) formulation |
| Battery Sensors | BMS processor/memory, | pressure, temperature, load current, and/or load voltage time histories | UTS, ITS |
| Age of battery, idle time | Data provided by battery manufacturer/supplier, BMS, telematics | Number of weeks/months since battery was first installed in a vehicle, or first discharged, last time battery was used | UTS, ITS |
| Charge/discharge cycles (full or partial charge discharge cycles) | BMS memory, cloud storage, vehicle telematics | Number of cycles of >80% of as-rated discharge of the battery based on distance traveled, or number of times arrived at cut-off point; and/or number of charge-discharge cycles of >80%, 50%, 30% etc.) | UTS, ITS |
| Ambient weather conditions | ECU, cloud storage | Temperature, relative humidity, during use verses idle time, when battery actively heated or not heated at low temperatures; operated at battery temperatures below 25 Deg. C or above 50 Deg. C | UTS, ITS |
| Battery duty cycles/driving pattern (discharge and regenerative charging - i.e., coasting, brakes) | ECU, telematics, BMS | Sampled voltage and current in/out of battery; | UTS, ITS |

Following is a description of battery models implemented as an Artificial Neural Network (ANN). The earlier example described a battery model implemented as the Random Forest (RF) type of decision tree. According to the various embodiments disclosed herein, either a RF or ANN is contemplated (or the other models for machine learning disclosed herein) and applicable to any of the variety of input parameters for a battery model, and/or vehicle or driver decision models as taught herein.

The nodes or neurons that make up the various layers of an ANN influence the target value based on their weighting. The individual weights assigned to each node may be thought of as the degree of influence that a particular input parameter has on the target, i.e., the greater the weighting associated with a particular input, the more a change in the input value affects the output (as compared to other inputs with lower weightings). The process of training an ANN model includes modifying these nodal weights so that the model is better able to match the target output in the training sets.

Modification of the nodal weights in response to new training sets can be performed relatively quickly, even for an ANN with many hidden layers and input parameters, using well known gradient methods. These methods compute a new nodal weight based on a rate of change in the target values influenced by that nodal weight (e.g., gradient methods such as Back Propagation Algorithm or Method of Steepest Descent). These methods reduce the error or unwanted bias in the model with respect to the sampled data represented in the training sets. But unless the solution space for the prediction is also restrained or limited in some way to prevent over-fitting, they can also greatly increase the generalization penalty or error in the model (i.e., the ability of the model to predict a new target based on input it has never experienced before, and not simply match the target values from the training sets). Known methods for updating nodal weights that balance the need to match the targets from the training sets (reduce model bias) while maintaining an acceptable variance in the model's predicted value vs. observed values for new data sets (a measure of the model's generalization error) is to minimize the standard error (SE), which is usually expressed indirectly in the form of a 90% or 95% confidence interval (requires a sufficient number of training sets are applied when the weights are updated). In general, the less the training sets the wider is the confidence interval (less accurate predictions) and the more training sets the narrower is the confidence interval (more accurate predictions).

Battery model training from a UTS (or ITS) may be structured as a three-step process: training step, validation step and test step. The matching of the model output to the UTS is the training step for the model. As noted earlier, a model's weights can be adjusted to match the UTS targets very accurately (assumes model's capacity is of a sufficient size) but the resulting new weights can also cause the model to adopt a large generalization error (variance in model's ability to predict new target values). Making adjustments to the trained model after training (or as part of the training step) to constrain or limit the values that the nodal weights can take, in order to minimize the generalization error (errors sometimes expressed in terms of variance or standard error) is the validation step. A separate set of empirical data (separate from UTS or a portion thereof) called the validation training set (VTS) may be used to validate a model. After the battery model has been trained and validated, it is tested using input parameter values and target values it has not experienced. This part of the model training is called the test step and the data used to test the model is the Test Model Set (TMS).

A battery model's ability to match the training data and generalize well (i.e., its bias and variance) is, of course, also inherent to the basic architecture of the model before any training sets are applied (e.g. for a neural network, what number of nodes/layers, what functional form to use for interconnections between nodes?).

When generating a UTS, embodiments may include a data-filtering or data-processing step for data intended for a UTS. In some embodiments, this step is needed to take into account the possibility that one or more sensors have become faulty or corrupted, due to age, or otherwise are producing noisy and unreliable signals. Or other data (received over internet, from user, etc.) is faulty, unreliable or became/is corrupted. If "bad" data is used to retrain the model, then the model's predictive capabilities could become worse, since it is being influenced by bad data. Embodiments of a system comprising the battery model may also include a data processing component (that can itself be a learning model) for detecting and excluding bad data from use in training sets.

According to some embodiments, a battery model may rely on a model bias ("bias" means the weighing or adjusting of nodal weights by non-learning methods to reduce generalization errors). For example, bias may be introduced for two reasons:

To reduce the influence of ITS or UTS data taken when the battery was new, when predicting SOC after the battery has aged significantly.

To account for infrequent events that can reduce the battery model's predictive ability or significantly alter a battery state value.

When the battery was new, input parameters that should have very little influence on a predicted battery state (e.g., charge efficiency) will have a correspondingly low nodal weight. However, after the battery has aged significantly these input parameters should have a significantly higher influence on the predicted battery state. The battery model may include a bias or other form of hyper-parameter to account for these kinds of effects reflecting differences between a new and aged battery. Such bias, or favoritism towards later-stage UTS over prior UTS, can provide a better fit to the later-stage UTS while preventing increases in the generalization error associated with introducing large nodal weights into the model during the training step.

Infrequent, though significant, events sometimes occur that have a profound effect on the SOC or other battery states. It may be best to account for the possible occurrence of one of these events by incorporating a bias into the model, rather than try to account for one of these effects by re-training the model. One example is the introduction of a model bias towards reducing the available SOC whenever there is a repair or safety warning issued during use, charging/discharging above 50° C. or below 10° C. These events can have a significant effect on battery states. It can be very difficult to predict by a learning method the effects of such an event on the battery, since the event does not occur often. The model can account for one of these events by a bias that incorporates an additional layer of uncertainty, such as automatically under-estimating the SOC by a given %.

TABLE 3.1, below, provides examples of when a UTS is generated and used to train the battery model. The learning module may be programmed to retrain the model with a new UTS whenever the vehicle has been driven a certain number of miles, or after a certain percentage of battery charge has been used, e.g., more than 5% or 10%. The learning module's memory may continuously receive and store the sensor data in its memory while the car is being used. Based on the type of use, the learning module will generate a new UTS from the data and train the model.

TABLE 3.1

Examples of events that generate a UTS and training of the model

Planned trips completed
Whenever the battery is externally recharged: immediately before, during and after charging
After or during every battery or vehicle service event, or diagnostic event
Whenever battery is discharged by more than 10%, more than 20%, 50%, or 80% during a single use
Before and after a repair or warning condition is indicated by the BMS, or ECU
Whenever a battery overheats, used when under-heated or over/under pressurized, after prolonged periods of idle time, especially in extreme temperatures
Whenever a periodic trip is completed (i.e., work commute)
Whenever the battery is in an open circuit condition
Whenever the battery is under an operating load, including operating loads for vehicle accessories
during a charging event
during a diagnostic event
during a repair event
during a safety event The UTS for this example of a battery model is summarized in TABLE 3.2. This example is for a battery model that estimates the state of charge as a battery ages and is used in a vehicle under a variety of conditions, locations and driver types.

TABLE 3.2

| Target/Objective | Data |
| --- | --- |
| SOC | Inferred from a predicted or measured loaded voltage, resting voltage, impedance, net energy throughput since last full charge and temperature |
| Input parameters | |
| 1  Battery current | Load current as sensed by vehicle power electronics unit |
| 2  Temperature | Thermistor located at each series string of battery cells |
| 3  Battery pressure | Piezoelectric sensor located at each series string of battery cells, and battery pressure is passively adjusted |
| 4  voltage | Ohmmeter data at battery terminals |
| 5  Ambient temperature | Battery operated after idle for 1 week at 0° F., ° F., 40 Deg F . . . 100° F. (5 different temperatures) |
| 6  Age | 1 month, 3 month, 6 month, 8 month and 12 month aged battery pack (for each of these aged batteries the number of cycles are 10 × months aged, e.g., 12 month aged battery has been discharged to 120 times) |
| 7  External charging | Battery overcharged, charging rate exceeds recommended charging rate |
| 8  Cycle history | Battery discharged over 80% 10, 50, 100 times |
| 9  Driving pattern | Battery subjected to duty cycle typical of eco-conscious driver, normal driving, aggressive driving, city, highway and mountains |

Vehicle/Driver Decision Model

According to the embodiments, a vehicle/driver decision model may be separate from the battery model or included as part of the battery model, e.g., vehicle/driver decisions are included in the output targets of the battery model. In the latter case the vehicle/driver decision model is included as part of the prediction module in FIG. 2.

Input parameters to a learning model disclosed herein may be selected from the group consisting of inputs that are personal to a user/vehicle, inputs that are generally applicable, inputs that are historical, inputs that are current, inputs that are sensed, inputs that are referenced, and combinations thereof. In various embodiments, a particular subset of input parameters may be used, as described and claimed herein.

Input parameters may be selected from a variety of sources, consistent with the purpose of a learning model disclosed herein. In some embodiments, input parameters are selected from the group consisting of vehicle use information, location information, drive types, temperature information, battery pressure information, heating device/battery/vehicle information, weather information, driver inputs, user information, external information, traffic information, calendar information, charging equipment availability information, and combinations thereof.

According to the various embodiments disclosed herein, the input parameters associated with a vehicle/driver decision model, sensor/controllers 209 associated with pressurization devices ('744 application) and heat exchangers (US20160059733) may also be included as part of the battery model input parameters.

TABLE 4 summarizes the types of input parameters associated with training a Vehicle and/or Driver Decision Model that takes into consideration age effects on the vehicle subsystems, such as its powertrain. The decision model may be incorporated into a DSBM. As mentioned earlier, the decision model may also be a separate learning model located with, e.g., the vehicle navigational unit, and having access to the prediction module output via a control area network. Separate vehicle/driver decision models and battery prediction modules may be desirable given the data used for the respective training sets and knowledge of the respective vehicle systems are owned and manufactured, respectively, by different entities, i.e., vehicle vs. battery manufacturers.

TABLE 4

| Vehicle/Driver Decision Model | | | |
| --- | --- | --- | --- |
| Input | Data Source | Input Parameters | How used |
| Vehicle/driver Decisions | vehicle manufacturer/supplier; and previously observed or estimated from observable quantities | reduce load current, pressurize battery, heat battery, reduce available power, energy available with respect to a planned route, alternative routes, diagnostic or repair warning | UTS, ITS training targets |
| Battery state | Predicted from Battery model | — | UTS, ITS |
| Driver/vehicle history | VIN, telematics, ECU, vehicle registration information | Accidents, warnings, driver demographics, age and driving pattern | UTS, ITS and model bias or hyper-parameters |
| Weather/location | ECU, cloud, GPS | Ambient temperature and relative humidity | UTS, ITS |
| Idle time, age | VIN, telematics, ECU, GPS | Number of days since last used, parked outside or indoors | UTS, ITS |
| Vehicle power train efficiency | | Vehicle power requirements, such as a capacity or efficiency of a heating device, powertrain of the vehicle, thermal system configuration of the vehicle, motor power of the vehicle, powertrain efficiency of the vehicle, vehicle minimum power output level for safe driving, | UTS, ITS |

In some embodiments of a vehicle decision model, the ITS and UTS include, as an input parameter, information reflecting the age, or wear and tear of a vehicle subsystem, e.g., loss in efficiency of electric motor or regenerative braking system, or loss of efficiency in heat dissipation, or increased heat buildup, increased circuit impedance, vehicle imbalances, effects of weather and temperature extremes on vehicle performance, past accidents or warnings issued, etc. For example, for an aged car the powertrain is not as efficient in converting a delivered charge to an output torque. The vehicle decision model incorporates this type of vehicle-age input when deciding whether, e.g., the vehicle can complete a long distance trip or needs to cut-off or reduce the HVAC to conserve power.

In other embodiments, the vehicle and vehicle subsystems are assumed to be operating in new, or like-new conditions. Thus, in these embodiments the only learning element of the vehicle decision model is the battery model.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various modifications are possible within the scope of the invention, as those skilled in the relevant art will recognize.

These modifications can be made to the invention in light of the above detailed description. The terms used in claims should not be construed to limit the invention to the specific embodiments disclosed in the specification.

Additional aspects of invention are set forth in the following Concepts 1-30:

Concept 1. A management system for electrochemical batteries, comprising
  at least one series string of battery cells;
  one or more sensors configured to provide sensor data obtained from the series string of battery cells, the sensor data comprising at least one of a measured voltage, current, impedance, pressure, or temperature; and
  a prediction module for a battery type, coupled to the one or more sensors, the prediction module comprising:
    a battery model that includes a plurality of input parameters and at least one target, wherein the plurality of input parameters include at least one of a voltage, current, impedance, pressure, and temperature input parameter, and the target is at least one battery state,
    a learning component that trains the battery model using training sets comprising values for the input parameters and targets, the learning component providing a trained battery model, and
    a prediction component that uses the trained battery model and a new set of values for the input parameters to predict a battery state;
  wherein the predicted battery state is at least one of a
    (a) state-of-charge (SOC),
    (b) state-of-health (SOH),
    (c) voltage response to current demand,
    (d) power available,
    (e) energy available,
    (f) energy available with respect to a planned route,
    (g) presence of a safety condition,
    (h) presence of a repair condition,
    (i) battery life,
    (j) battery temperature,
    (k) battery voltage,
    (l) battery impedance, and
    (m) battery cell pressure.

Concept 2. The management system of Concept 1, wherein the sensor data is obtained from one or more of, or a combination of, a measured voltage, current, impedance, pressure, or temperature of one or more of
    (a) a battery cell,
    (b) a stack of battery cells,
    (c) a pouch comprising battery cells,
    (d) a can comprising battery cells,
    (e) a module comprising cans, and
    (f) a battery pack.

In some examples, the sensor data is obtained from one or more of, or a combination of, a measured voltage, current, impedance, pressure, or temperature of a battery cell. In some examples, the sensor data is obtained from one or more of, or a combination of, a measured voltage, current, impedance, pressure, or temperature of a stack of battery cell. In some examples, the sensor data is obtained from one or more of, or a combination of, a measured voltage, current, impedance, pressure, or temperature of a pouch comprising battery cells. In some examples, the sensor data is obtained from one or more of, or a combination of, a measured voltage, current, impedance, pressure, or temperature of a module comprising cans. In some examples, the sensor data is obtained from one or more of, or a combination of, a measured voltage, current, impedance, pressure, or temperature of a battery pack.

Concept 3. The management system of Concept 1, wherein the battery model includes additional input parameters, the additional input parameters comprising one or more of
    (a) the age of the battery,
    (b) a last battery, or power train servicing date,
    (c) a vehicle identification number (VIN), or make and model,
    (d) a driving pattern,
    (e) a geographic location or predicted weather forecast,
    (f) an age of a registered driver,
    (g) number of discharge cycles, or average percentage of battery discharge between charging,
    (h) number of warning conditions issued on battery,
    (i) "input parameters" disclosed in US20160059733,
    (j) manufacturer inputs selected from rated capacity, voltage window, and thermal characteristics;
  wherein the prediction model is trained on both the one or more sensor data and the additional parameters.

Concept 4. The management system of Concept 1, the one or more sensors comprising
  one or more sensors configured to measure pressure of the series string of battery cells, a module of batteries, and/or individual battery cells,
  a sensor configured to measure voltage of the series string of battery cells,
  a sensor configured to measure total charge passed through the series string of battery cells, and/or
  temperature sensors configured to measure ambient temperature and battery series temperature in at least one location.

Concept 5. The management system of Concept 4, wherein the sensor configured to measure voltage of the series string of battery cells, the sensor configured to measure total charge passed through the series string of battery cells, and/or the temperature sensors configured to measure ambient temperature and battery series temperature in at least one location are a single sensor.

Concept 6. The management system of Concept 4, wherein the sensor configured to measure voltage of the series string of battery cells, and/or the temperature sensors configured to measure ambient temperature and battery series temperature in at least one location are a single sensor.

Concept 7. The management system of Concept 5 or 6, wherein the single sensor is integrated into a bus bar.

Concept 8. The management system according to any combination of Concepts 1-7, wherein
the at least one series string of battery cells and the one or more sensors are located on a vehicle,
the vehicle further comprising a processor capable of being coupled to a server accessible over one or more networks, and
the prediction module is accessible to the processor through the server.

Concept 9. A vehicle comprising the management system according to any combination of Concepts 1-8.

Concept 10. The vehicle of Concept 9, wherein the vehicle further comprises:
a processor; and
a computer readable, non-transitory medium comprising the prediction module stored as computer readable code configured for being executed by the processor;
wherein the prediction module is coupled to the sensors through the processor.

Concept 11. The vehicle of Concept 10, further including a Battery Management System (BMS), the BMS comprising:
the processor,
the computer readable, non-transitory medium, and
the one or more sensors.

Concept 12. The vehicle of Concept 9, wherein the vehicle further comprises
an electronic control unit (ECU);
a vehicle information storage unit accessible by the ECU and providing vehicle data comprising one or more of
(a) a last battery, or power train servicing date,
(b) a vehicle identification number (VIN), or make and model,
(c) a driving pattern based on, e.g., samples of real-time battery discharge and regenerative charging data corresponding to a vehicle powertrain delivered torques and braking sequences,
(d) a geographic location(s) of vehicle use, and
(e) the vehicle data listed in TABLE 4;
wherein the battery model input parameters include the at least one of a voltage, current, impedance, pressure, and temperature input parameter, and at least one of the vehicle data input parameter.

Concept 13. The vehicle of Concept 12, wherein the vehicle information storage unit is a telematics device.

Concept 14. A method, comprising:
using a vehicle;
using a battery model having input parameters including at least one of a voltage, current, impedance, pressure, or temperature input parameter for a battery type, and at least one target for the battery type;
using at least one or more sensors located on the vehicle, obtaining data on at least one physical state of at least one series string of battery cells of the vehicle, wherein the data obtained comprises at least one of a measured voltage, current, impedance, pressure, or temperature of the at least one series string of battery cells;
making a trained battery model, including training the battery model using training sets comprising values for each one of the input parameters and a corresponding value for the at least one target using at least the obtained data;
wherein the obtaining data step occurs while the series string of battery cells is
(a) in an open circuit condition,
(b) under an operating load, including operating loads for vehicle accessories as described in U.S. Pat. No. 9,393,921,
(c) during a charging event,
(d) during a diagnostic event,
(e) during a repair event, and/or
(f) during a safety event.

Concept 15. The method of Concept 14, further comprising:
receiving new training sets for the battery type over a network; and
re-training the battery model on the new training sets.

Concept 16. The method of Concept 14, wherein the vehicle has a processor and a non-transitory memory medium, the battery model residing in the non-transitory memory medium, the method further including
using the vehicle processor to predict a battery state using the trained battery model and a new training set, and
producing an output based on the predicted battery state.

Concept 17. The method of Concept 16, wherein the output is displayed on a user interface (UI) such as a vehicle user interface (VUI) or a mobile device.

Concept 18. The method of Concept 17, wherein the UI displays one or more of the following information in the output,
(a) repair battery when the predicted battery state predicts the SOH is below 50%,
(b) warning message when the predicted battery state predicts an unsafe battery condition,
(c) warning message when the predicted battery state predicts energy available is insufficient for predicted event, such as trip entered into navigation system, and
(d) warning message when the predicted battery state predicts power available insufficient for a predicted event, such as hill climb or acceleration needed to enter high-speed highway.

Concept 19. The method of Concept 16, wherein the output is sent to a vehicle control system, and wherein the vehicle control system performs one or more of the following tasks based on the predicted state of the battery:
when SOC is about 80%, battery is allowed to discharge at maximum operating power rate,
limit the power availability when the SOC is below 20% or below 15% or below 10%,
notify driver when the predicted power availability is below 6 kilowatts (kW) or 5 kW or 4 kW or 3 kW or 2 kW or 1 kW, and
limit power to auxiliary systems when the predicted power availability is below 6 kW or 5 kW or 4 kW or 3 kW or 2 kW or 1 kW.

Concept 20. The method of Concept 14, wherein the vehicle has a processor configured for being coupled to a server located over one or more networks and the battery model is accessible through the server, the method further comprising:
uploading to the server the obtained data, and
receiving the trained battery model from the server.

Concept 21. A computer-implemented method, comprising:
using a battery model having a plurality of input parameters and at least one target, wherein the input parameters correspond to at least one of a voltage, current, impedance, pressure, or temperature for a battery type, and the at least one target is a battery state;

training the battery model using a plurality of training sets, the training sets comprising values for each input parameters of the battery model, and a value for the at least one target;

receiving new values for the input parameters; and predicting the at least target from the new values using the trained battery model.

Concept 22. The method of Concept 21, wherein the training sets are an update training set (UTS), further comprising:

receiving the UTS having values based on measured battery characteristics for an aged battery or second battery type, different from the first battery type, and re-training the battery model using the UTS.

Concept 23. The method of Concept 21, wherein the battery model comprises a structured probabilistic model (graph model), an artificial neural network (ANN) model, gradient boosted machine, ridge regression, lasso regression, a nearest-neighbor regression, naive Bayes, support vector machine, or an ensemble method.

Concept 24. The method of Concept 23, wherein the predictive model is a random forest model.

Concept 25. The method of Concept 21, wherein the battery model comprises:

a system battery model having system input parameters representing component battery states, and at least one system target, and a plurality of component battery models, each having the input parameters and the at least one target is the component battery state, wherein the new training set comprises new training sets for the component battery models and the system battery model.

Concept 26. The method of Concept 21, wherein the predicted state for a battery component is a predicted state for a (a) a battery cell, (b) a stack of battery cells, (c) a pouch comprising battery cells, (b) a can comprising battery cells, (c) a module comprising cans, or (d) a battery pack.

Concept 27. A computer readable non-transitory medium comprising computer readable code operable, in use, to instruct a computer to perform the method of any of Concepts 21-26.

Concept 28. The system of any of Concepts 1-13, wherein the prediction module is configured to retrain the battery model on a continuous basis, optionally second-by-second, as the sensor data provides the prediction module with time varying values for the at least one of a measured voltage, current, impedance, pressure, or temperature.

Concept 29. The method of any of Concepts 14-20, wherein the training step further includes training the battery model on a continuous basis as the sensor data produces time varying values for the at least one of a measured voltage, current, impedance, pressure, or temperature.

Concept 30. The method of any of Concepts 21-27, wherein the training step further includes training the battery model on a continuous basis, optionally on a second-by-second basis, as time varying values for the at least one of a measured voltage, current, impedance, pressure, or temperature become available.

What is claimed is:

1. A management system for electrochemical batteries, comprising at least one series string of battery cells, wherein the battery cells comprise a solid-state lithium secondary battery, wherein the solid-state lithium secondary battery includes a lithium-stuffed garnet electrolyte;

one or more sensors configured to provide sensor data obtained from the series string of battery cells, the sensor data comprising at least one of a measured voltage, current, impedance, pressure, or temperature; and a prediction module for a battery type, coupled to the one or more sensors, the prediction module comprising:

a battery model that includes a plurality of input parameters and at least one target, wherein the plurality of input parameters include at least one of a voltage, current, impedance, pressure, and temperature input parameter, and the target is at least one battery state, a learning component that trains the battery model using training sets comprising values for the input parameters and targets, the learning component providing a trained battery model, and a prediction component that uses the trained battery model and a new set of values for the input parameters to predict a battery state;

wherein the predicted battery state is at least one of a (a) state-of-charge (SOC), (b) state-of-health (SOH), (c) voltage response to current demand, (d) power available, (e) energy available, (f) energy available with respect to a planned route, (g) presence of a safety condition, (h) presence of a repair condition, (i) battery life, (j) battery temperature, (k) battery voltage, (l) battery impedance, and (m) battery cell pressure wherein the battery model includes additional input parameters, the additional input parameters comprising one or more of (a) the age of the battery, (b) a last battery, or power train servicing date, (c) a vehicle identification number (VIN), or make and model, (d) a driving pattern, (e) a geographic location or predicted weather forecast, (f) an age of a registered driver, (g) number of discharge cycles, or average percentage of battery discharges between charges using an external power source, and (h) number of warning conditions issued on the battery, wherein the trained battery model is trained on both the one or more sensor data and the additional parameters.

2. The management system of claim 1, wherein the sensor data is obtained from one or more of, or a combination of, a measured voltage, current, impedance, pressure, or temperature of one or more of (a) a battery cell, (b) a stack of battery cells, (c) a pouch comprising battery cells, (d) a can comprising battery cells, (e) a module comprising cans, and (f) a battery pack.

3. The management system of claim 1, wherein the additional input parameters comprising one or more of
(a) the age of the battery,
(b) a last battery, or power train servicing date,
(c) a vehicle identification number (VIN),
(f) an age of a registered driver,
(g) number of discharge cycles, or average percentage of battery discharges between charges using an external power source, and
(h) number of warning conditions issued on the battery.

4. The management system of claim 1, the one or more sensors comprising
one or more sensors configured to measure pressure of the series string of battery cells, a module of batteries, and/or individual battery cells,
a sensor configured to measure voltage of the series string of battery cells,
a sensor configured to measure total charge passed through the series string of battery cells, and/or
temperature sensors configured to measure ambient temperature and battery series temperature in at least one location.

5. The management system of claim 4, wherein the sensor configured to measure voltage of the series string of battery cells, the sensor configured to measure total charge passed through the series string of battery cells, and/or the temperature sensors configured to measure ambient temperature and battery series temperature in at least one location is a single sensor.

6. The management system of claim 4, wherein the sensor configured to measure voltage of the series string of battery cells, and/or the temperature sensors configured to measure ambient temperature and battery series temperature in at least one location is a single sensor.

7. The management system of claim 5, wherein the single sensor is integrated into a bus bar.

8. The management system according to claim 1, wherein
the at least one series string of battery cells and the one or more sensors are located on a vehicle,
the vehicle further comprising a processor capable of being coupled to a server accessible over one or more networks, and
the prediction module is accessible to the processor through the server.

9. The management system of claim 1, wherein the battery cells are actively pressurized.

10. A vehicle comprising the management system according to claim 1.

11. The vehicle of claim 10, wherein the vehicle further comprises:
a processor; and
a computer readable, non-transitory medium comprising the prediction module stored as computer readable code configured for being executed by the processor;
wherein the prediction module is coupled to the sensors through the processor.

12. A method, comprising:
using a vehicle;
using a battery model having input parameters including at least one of a voltage, current, impedance, pressure, or temperature input parameter for a battery type, and at least one target for the battery type;
using at least one or more sensors located on the vehicle, obtaining data on at least one physical state of at least one series string of battery cells of the vehicle, wherein the at least one series string of battery cells is a solid-state lithium secondary battery, wherein the solid-state lithium secondary battery includes a lithium-stuffed garnet electrolyte, wherein the data obtained comprises at least one of a measured voltage, current, impedance, pressure, or temperature of the at least one series string of battery cells;
making a trained battery model, including training the battery model using training sets comprising values for each one of the input parameters and a corresponding value for the at least one target using at least the obtained data,
wherein the trained battery model includes additional input parameters, the additional input parameters comprising one or more of
(a) the age of the battery,
(b) a last battery, or power train servicing date,
(c) a vehicle identification number (VIN), or make and model,
(d) a driving pattern,
(e) a geographic location or predicted weather forecast,
(f) an age of a registered driver,
(g) number of discharge cycles, or average percentage of battery discharges between charges using an external power source,
(h) number of warning conditions issued on the battery,
wherein the trained battery model is trained on both the one or more sensor data and the additional parameters;
wherein the obtaining data step occurs while the series string of battery cells is
(a) in an open circuit condition,
(b) under an operating load,
(b) during a charging event,
(c) during a diagnostic event,
(d) during a repair event, or
(e) during a safety event.

13. The method of claim 12, further comprising:
receiving new training sets for the battery type over a network; and
re-training the battery model on the new training sets.

14. The method of claim 12, wherein the vehicle has a processor and a non-transitory memory medium, the battery model residing in the non-transitory memory medium, the method further including
using the vehicle processor to predict a battery state using the trained battery model and a new training set, and
producing an output based on the predicted battery state.

15. The method of claim 14, wherein the output is displayed on a user interface (UI) of a vehicle user interface (VUI) or a mobile device.

16. The method of claim 15, wherein the UI displays one or more of the following information in the output,
(a) repair battery when the predicted battery state predicts the state-of-health (SOH) is below 50%,
(b) warning message when the predicted battery state predicts an unsafe battery condition,
(c) warning message when the predicted battery state predicts energy available is insufficient for a predicted event, and
(d) warning message when the predicted battery state predicts power available insufficient for the predicted event.

17. The method of claim 14, wherein the output is sent to a vehicle control system, and wherein the vehicle control system performs one or more of the following tasks based on the predicted state of the battery:
when SOC is 80%, battery is allowed to discharge at maximum operating power rate, limit the power availability when the SOC is below 20% or below 15% or below 10%, notify driver when the predicted power availability is below 6 kW or 5 kW or 4 kW or 3 kW or 2 kW or 1 kW, and limit power to auxiliary systems when the predicted power availability is below 6 kW or 5 kW or 4 kW or 3 kW or 2 kW or 1 kW.

18. The method of claim 12, wherein the vehicle has a processor configured for being coupled to a server located over one or more networks and the battery model is accessible through the server, the method further comprising:

uploading to the server the obtained data, and receiving the trained battery model from the server.

19. The method of claim 12, wherein the prediction module is configured to retrain the battery model on a continuous basis, as the sensor data provides the prediction module with time varying values for the at least one of a measured voltage, current, impedance, pressure, or temperature.

20. The method of claim 16, wherein the predicted event is a trip entered into a navigation system.

21. The method of claim 16, wherein the predicted event is a hill climb or acceleration needed to enter a high speed highway.

\* \* \* \* \*